(12) United States Patent
Nakayama

(10) Patent No.: US 6,604,058 B2
(45) Date of Patent: Aug. 5, 2003

(54) SEMICONDUCTOR DEVICE TESTING APPARATUS AND METHOD FOR TESTING SEMICONDUCTOR DEVICE

(75) Inventor: Hiroyasu Nakayama, Tokyo (JP)

(73) Assignee: Advantest Corporation, Tokyo (JP)

( * ) Notice: Subject to any disclaimer, the term of this patent is extended or adjusted under 35 U.S.C. 154(b) by 74 days.

(21) Appl. No.: 09/842,859

(22) Filed: Apr. 27, 2001

(65) Prior Publication Data

US 2001/0041967 A1 Nov. 15, 2001

(30) Foreign Application Priority Data

Apr. 28, 2000 (JP) ........................................ 2000-131174

(51) Int. Cl.[7] ........................ G01R 27/28; G06F 17/50
(52) U.S. Cl. ........................ 702/117; 438/17; 716/4
(58) Field of Search .................... 702/89, 102, 117, 702/118, 119, 120, 123; 714/7, 718, 719, 726; 438/17; 716/4; 365/185.3, 185.11, 185.23, 185.24, 200, 201

(56) References Cited

U.S. PATENT DOCUMENTS 6,163,875 A * 12/2000 Suzuki ........................... 716/4
6,391,667 B1 * 5/2002 Hashimoto .................... 438/17

FOREIGN PATENT DOCUMENTS

| DE | 197 46 695 A1 | 6/1998 | ........... G11C/29/00 |
|---|---|---|---|
| DE | 100 17 619 A1 | 11/2000 | ........ G01R/31/3183 |
| JP | 6-259962 | 9/1994 | |
| WO | WO 94/24674 | 10/1994 | |

OTHER PUBLICATIONS

German Office Action dated Dec. 16, 2002.

Office Action dated Dec. 31, 2002 for Korean Patent Application No. 046874401, 1 page (no translation).

* cited by examiner

*Primary Examiner*—John Barlow
*Assistant Examiner*—John Le
(74) *Attorney, Agent, or Firm*—Rosenthal & Osha L.L.P.

(57) ABSTRACT

A test signal supplying apparatus for a semiconductor device testing apparatus that tests a plurality of semiconductor devices; including: a test pattern generating unit for outputting an input signal pattern to the semiconductor devices and receiving a match signal which indicates the semiconductor device, to which the input signal pattern is applied, is passed in the test; and a match-fail detecting unit for receiving the match signal to detect a semiconductor device that fails in the test and outputting a match-fail signal for identifying the semiconductor device that fails in the test; and a stop signal output unit connected to the match-fail detecting unit for receiving the match-fail signal from the match-fail detecting unit, storing the match-fail signal, and outputting a first stop signal that stops an application of the input signal pattern to the semiconductor devices that fail in the test identified by the stored match-fail signal.

31 Claims, 20 Drawing Sheets

| ADDRESS | INSTRUCTION | PIN 123 ............ 3132 | | |
|---|---|---|---|---|
| #0000 | APPLYING PATTERN | INPUT-SIGNAL PATTERN1 | EXPECTATION VALUE SIGNAL PATTERN1 | TEST1 |
| #0020 | APPLYING PATTERN | | | |
| #0021 | REPEATING LOOP 100 TIMES | PN0101 | × × × × × × | |
| | MATCH CYCLE | PN0101 | × × × ×Ⓛ× | |
| #0030 | JUMP TO #0021 | PN0101 | × × × × × × | |
| #0031 | APPLYING PATTERN | INPUT-SIGNAL PATTERN2 | EXPECTATION VALUE SIGNAL PATTERN2 | TEST2 |
| #0050 | APPLYING PATTERN | | | |
| #0051 | REPEATING LOOP 100 TIMES | PN0101 | × × × × × × | |
| | MATCH CYCLE | PN0101 | × × × ×Ⓛ× | |
| #0060 | JUMP TO #0051 | PN0101 | × × × × × × | |
| #0061 | . . . . . | . . . . . | . . . . . | |

SEMICONDUCTOR DEVICE TESTING APPARATUS AND METHOD FOR TESTING SEMICONDUCTOR DEVICE

This patent application claims priority from Japanese patent application No. 2000-131174 filed on Apr. 28, 2000, the contents of which are incorporated herein by reference.

BACKGROUND OF THE INVENTION

1. Field of the Invention

The present invention relates to a semiconductor device testing apparatus for testing a semiconductor device. In particular, the present invention relates to a semiconductor device testing apparatus that does not interrupt a test just after restarting of the test and also does not apply an input-signal pattern to the semiconductor device, which causes a match-fail, until the end of the test.

2. Description of the Related Art

FIG. 1 is a block diagram that shows a configuration of a pattern generator 10 of a conventional semiconductor device testing apparatus. The pattern generator 10 has a match-fail detecting unit 20, a sequence control unit 40, and a pattern data memory 50. A control apparatus 210 controls each unit of the pattern generator 10. Each unit of the pattern generator 10 receives a clock signal that is output from a reference clock generator 60.

The semiconductor device testing apparatus is used for testing a logic IC such as a system LSI. In particular, the semiconductor device testing apparatus 100 can test a plurality of semiconductor devices at the same time. The pattern generator 10 generates an input-signal pattern 12 and an expectation value signal pattern 14 according to the predetermined control sequence. The input-signal pattern 12 is a signal to be input to a semiconductor device that is an object to be tested. The expectation value signal pattern 14 is a signal to be output from the semiconductor device when the input-signal pattern 12 is applied to the semiconductor device.

The pattern data memory 50 stores data of the input-signal pattern 12 and the expectation value signal pattern 14. The sequence control unit 40 outputs an address signal 45 to the pattern data memory 50 so that the pattern data memory 50 generates the input-signal pattern 12 and the expectation value signal pattern 14. The sequence control unit 40 receives a match signal 96 from the match signal generator 94. The match signal 96 shows whether the output-signal pattern, which is output from the semiconductor device when the input-signal pattern 12 is applied to the semiconductor device, becomes the predetermined value that is determined based on the expectation value signal pattern 14. The match-fail detecting unit 20 outputs a match-fail signal 22 to the sequence control unit 40 when the match-fail detecting unit 20 has not received a match signal 96 during a match cycle while waiting for the match signal 96.

The sequence control unit 40 includes a pattern counter 42, an address counter 44, and a controller 46. The pattern counter 42 counts match cycles. The address counter 44 counts addresses of control sequences. The controller 46 controls the pattern counter 42 and the address counter 44 according to the predetermined control sequence. The controller 46 also outputs a match cycle signal 43 to the match-fail detecting unit 20. The match cycle signal informs the match-fail detecting unit 20 that the matching process is being processed. The controller 46 further outputs a clock control signal 48 to the reference clock generator 60 to stop generation of a clock signal when the controller 46 receives a match-fail signal 22 from the match-fail detecting unit 20. The clock control signal 48 controls the reference clock generator 60 to stop generating a clock signal.

The controller 46 controls the pattern counter 42 and the address counter 44 in order to continue the control sequence when the controller 46 receives the match signal 96 during the match cycle. On the other hand, if the controller 46 receives the match-fail signal 22, the controller 46 controls the pattern counter 42 and the address counter 44 in order to stop the control sequence, and the controller 46 executes a fail stop process that outputs the clock control signal 48. The fail stop process stops a test. The test has to be started over again to restart the testing.

When a plurality of semiconductor devices are tested at the same time, a test is performed while confirming whether the writing of the input-signal pattern 12 to all the semiconductor devices and reading of the output-signal pattern from all the semiconductor devices have been finished normally. Thus, a series of tests are divided into several steps, and whether the reading and writing process of each semiconductor devices 200 has been finished is confirmed during a match cycle. The match cycle is a predetermined time period between each step of the series of tests. If the reading and writing process of each semiconductor device 200 has not been finished during the match cycle, it is found that there is a defective device within any one of a plurality of semiconductor devices. After the test is stopped, the defective device is removed from the test object, and then the test is restarted.

FIG. 2 is a flow chart that shows a process for testing one semiconductor device using a conventional semiconductor device testing apparatus. The input-signal pattern 12 is applied to a semiconductor device at test 1 (S102). Then, if the output-signal pattern output from the semiconductor device matches the predetermined value that is determined based on the expectation value signal pattern 14 during the match cycle (S104), a test 2 (S106) is performed continuously. However, if the output-signal pattern output from the semiconductor device does not match the predetermined value that is determined based on the expectation value signal pattern 14 during the match cycle (S104), the test finishes at that point as match-fail. Then, the same process is performed at a match cycle (S108) after the test 2 (S106). If the test 3 (S110) is finished, all the processes of testing have been finished.

FIG. 3 is a flow chart that shows a process for testing a plurality of semiconductor devices at the same time using a conventional semiconductor device testing apparatus. As shown in FIG. 3, if the output-signal pattern output from the semiconductor device matches the predetermined value during the match cycle (S154, yes) after the test 1 (S152) is performed, a test 2 (S156) is performed continuously.

However, if the output-signal pattern output from the semiconductor device does not match the predetermined value during the match cycle (S154, no) after the test 1 (S152) is performed, the test is stopped at that point as match-fail (S162). To test the other devices continuously after removing the semiconductor device that causes the match-fail from the test object after stopping the test (S164), the test 1 (S152) is performed again from the beginning. If the test does not continue, the test ends at that point.

After the test 2 (S156) has been performed, the same process using the process of the match cycle (S154) is performed at the match cycle (S158). If the output-signal pattern output from the semiconductor device does not match the predetermined value during the match cycle (S158, no) after the test 2 (S156) is performed, the test is stopped at that point as match-fail (S162). To test the other devices continuously after removing the semiconductor device that causes the match-fail from the test object after stopping the test (S164), the test 1 (S152) is performed again from the beginning. If the test does not continue, the test ends at that point. If the test 3 (S160) is finished, all the processes of the test end.

FIG. 4 is a time chart that shows a process for testing a plurality of semiconductor devices at the same time using a conventional semiconductor device testing apparatus. As shown in FIG. 4, a plurality of semiconductor devices are tested to see whether the output-signal pattern output from the semiconductor device matches the predetermined value during a match cycle (S204) after performing a test 1 (S202).

Here, the test for all the devices is stopped when any one of the semiconductor devices causes match-fail (S206). Then, the semiconductor device that causes the match-fail is removed from the test object (S208). Then, the test starts again from the test 1 (S210) for the other remaining semiconductor devices. Then, the test 1 (S210), a test 2 (S214), and a test 3 (S218) are performed successively, and if the match-fail does not occur at each of the match cycles (S212, S216), all the processes of the test end.

Conventionally, when a plurality of semiconductor devices are tested at the same time, and if the match-fail occurs for one of the semiconductor devices during the match cycle, the test for all the semiconductor devices is stopped, and then the semiconductor device that causes the match-fail is removed from the test object. Moreover, to finish the test for the remaining semiconductor devices, the test should be started again from the beginning. Thus, the object of reducing the whole testing time by testing a plurality of semiconductor devices at the same time cannot be achieved by the apparatus and the method described above.

Furthermore, in a case of testing a system LSI that contains a built-in flush memory, and if the test is restarted from the beginning after the test is stopped halfway by the match-fail, the data may be written into the flush memory excessively so as to destroy the flush memory because the same data is written into the flush memory repeatedly. Thus, the test cannot be performed in the result.

Furthermore, in a case of testing a system LSI that contains a built-in phase lock loop device (PLL device), a clock has to be applied to the system LSI continuously for a period of time in order to lock the PLL prior to the start of the test. Therefore, to restart the test for the remaining semiconductor devices after the test is stopped because of the match-fail, we have to wait until the PLL is locked each time for restarting the test. Therefore, the test cannot be started immediately.

SUMMARY OF THE INVENTION

Therefore, it is an object of the present invention to provide a semiconductor device testing apparatus and method for testing semiconductor device, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a test signal supplying apparatus for a semiconductor device testing apparatus that tests a plurality of semiconductor devices comprises: a test pattern generating unit for outputting an input signal pattern to the semiconductor devices and receiving a match signal which indicates the semiconductor device, to which the input signal pattern is applied, is passed in the test; and a match-fail detecting unit for receiving the match signal to detect a semiconductor device that fails in the test and outputting a match-fail signal for identifying the semiconductor device that fails in the test; and a stop signal output unit connected to the match-fail detecting unit for receiving the match-fail signal from the match-fail detecting unit, storing the match-fail signal, and outputting a first stop signal that stops an application of the input signal pattern to the semiconductor devices that fail in the test identified by the stored match-fail signal.

The stop signal output unit may further output a second stop signal that stops application of the input signal pattern to the semiconductor devices that passes the test indicated by the match signal. The stop signal output unit may have a register connected to the match-fail detecting unit for receiving the match-fail signal from the match-fail detecting unit and storing the match-fail signal.

The stop signal output unit may further have a logical addition circuit connected to the register for receiving the match signal and the match-fail signal stored in the register to output the first stop signal or the second stop signal. The stop signal output unit may output the second stop signal during a predetermined cycle; and the test pattern generating unit may restart the application of the input signal pattern to the semiconductor devices after the end of the predetermined cycle.

The stop signal output unit may output the first stop signal until the end of the test. The stop signal output unit may output the second stop signal during a predetermined cycle; and the test pattern generating unit may output the input signal pattern after the end of the predetermined cycle.

According to the second aspect of the present invention, a semiconductor device testing apparatus for testing a plurality of semiconductor devices; comprises: a test pattern generating unit for outputting an input signal pattern to the semiconductor devices and outputting an expectation value signal pattern, which is expected to be output from the semiconductor device when the input signal pattern is applied to the semiconductor device; a comparator that compares an output signal patterns, which are output from the plurality of semiconductor devices, and a predetermined value determined based on the expectation value signal pattern and outputs a match signal when the output signal patterns match the predetermined value; a match-fail detecting unit for receiving the match signal to detect a semiconductor device, the output signal pattern of which does not match the predetermined value, and outputting a match-fail signal for identifying the semiconductor device, the output signal pattern of which does not match the predetermined value; and a stop signal output unit connected to the match-fail detecting unit for receiving the match-fail signal from the match-fail detecting unit, storing the match-fail signal, and outputting a first stop signal that stops application of the input signal pattern to the semiconductor devices, the output signal patterns of which does not match the predetermined value, identified by the stored match-fail signal.

The stop signal output unit may further output a second stop signal that stops application of the input signal pattern to the semiconductor devices, the output signal patterns of which matches the predetermined value. The stop signal output unit may have a register connected to the match-fail detecting unit for receiving the match-fail signal from the match-fail detecting unit and storing the match-fail signal.

The stop signal output unit may further have a logical addition circuit connected to the register for receiving the match signal and the match-fail signal stored in the register to output the first stop signal or the second stop signal. The semiconductor device testing apparatus may further comprise a waveform formatter connected to said test pattern generating unit and said stop signal output unit for receiving said input signal pattern from said test pattern generating unit, receiving the first stop signal or the second stop signal from the stop signal output unit, formatting and outputting the input signal pattern except when receiving the first stop signal or the second stop signal.

The waveform formatter may output the input signal pattern except when the waveform formatter receives the first stop signal until the end of the test. The stop signal output unit may output the second stop signal during a predetermined cycle; and the test pattern generating unit may output the input signal pattern to the waveform formatter after the end of the predetermined cycle.

According to the third aspect of the present invention, a method for testing a plurality of semiconductor devices; comprise: outputting an input signal pattern to the semiconductor devices; outputting an expectation value signal pattern, which is expected to be output from the semiconductor device when the input signal pattern is applied to the semiconductor device; comparing an output signal patterns, which are output from the plurality of semiconductor devices, and a predetermined value determined based on the expectation value signal pattern; outputting the match signal when the output signal patterns matches the predetermined value; outputting a match-fail signal when the output signal pattern output from the semiconductor device does not match the predetermined value; storing the match-fail signal; and outputting a first stop signal for stopping an application of the input signal pattern to the semiconductor devices identified by the stored match-fail signal.

The outputting the first stop signal may further output a second stop signal that stops application of the input signal pattern to said semiconductor devices when said output signal patterns matches said predetermined value. The semiconductor device testing apparatus may further comprise: formatting and outputting said input signal pattern to the semiconductor device except when receiving the first stop signal or the second stop signal.

The formatting and outputting may output the input signal pattern except when receiving the first stop signal until the end of the test. The outputting the second stop signal may output the second stop signal during a predetermined cycle; and the outputting the input signal pattern may output the input signal pattern after the end of the predetermined cycle.

According to the fourth aspect of the present invention, a method for testing a semiconductor device for testing a plurality of semiconductor devices, comprises: a step of applying an input signal pattern to each of the plurality of semiconductor devices; a step of stopping for applying the input signal pattern to the semiconductor devices that output an active match signal, the match signal becomes active when an output signal pattern output from the semiconductor device matches a predetermined value; and a step for restarting for applying the input signal pattern only to the semiconductor devices that output the active match signal.

The step of stopping may further stop applying the input signal pattern to the plurality of semiconductor devices except the semiconductor device to which the application of the input signal pattern is restarted by the restarting. The step of stopping may stop applying the input signal pattern to the semiconductor devices that output the active match signal during a predetermined cycle; and the step of restarting may restart the application of the input signal pattern to the semiconductor devices after the end of the predetermined cycle.

The step of stopping may further stop applying the input signal pattern to the plurality of semiconductor devices except the semiconductor devices to which the application of the input signal pattern is restarted until the end of the test.

The method may further comprise: generating an input signal pattern that is to be input to the plurality of semiconductor devices, and an expectation value signal pattern that is expected to be output from the plurality of semiconductor devices when the input signal pattern is applied to the semiconductor device; and comparing a plurality of the output signal patterns output from the plurality of semiconductor devices and the predetermined value determined based on the expectation value signal pattern and outputs the active match signal when the output signal pattern matches the predetermined value.

The method may further comprise: a step of formatting a waveform of the input signal pattern; and a step of outputting the formatted input signal pattern to the semiconductor device; wherein: the step of formatting includes: a step of stopping for outputting at least a part of the input signal pattern to the semiconductor device that outputs the active match signal; a step of restarting for outputting the input signal pattern only to the semiconductor devices that output the active match signal; and a step of stopping for applying the input signal pattern to the plurality of semiconductor devices except the semiconductor device to which the application of the input signal pattern is restarted.

The step of stopping may output a first stop signal that stops applying the input signal pattern to the semiconductor devices that outputs the active match signal. The step of stopping may further output a second stop signal that stops applying the input signal pattern to the semiconductor devices except the semiconductor device to which the application of the input signal pattern is restarted by the step of restarting. The step of stopping may further include a step of detecting whether any one of the plurality of semiconductor devices does not output the active match signal during a predetermined cycle.

The step of stopping may further include: a step of storing which of the semiconductor devices do not output the active match signal that is detected by the detecting during the predetermined cycle; and a step of outputting the first stop signal when the semiconductor device outputs the active math signal during the predetermined cycle or when the semiconductor device is stored by the storing. The step of outputting the stop signal may further output the second stop signal until the end of the test.

According to the fifth aspect of the present invention, a method for testing a plurality of semiconductor devices, comprises: testing the semiconductor device by applying an input signal pattern repeatedly to the semiconductor device for a predetermined period; and stopping the test of the semiconductor device to which an input signal pattern is written imperfectly while continuing the testing for the semiconductor device to which the input signal pattern is written perfectly.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIGS. 11A–11B shows a control sequence of the sequence control unit 40, and a corresponding input signal pattern 12 and expectation value signal pattern 14 that are stored into the pattern data memory 50.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
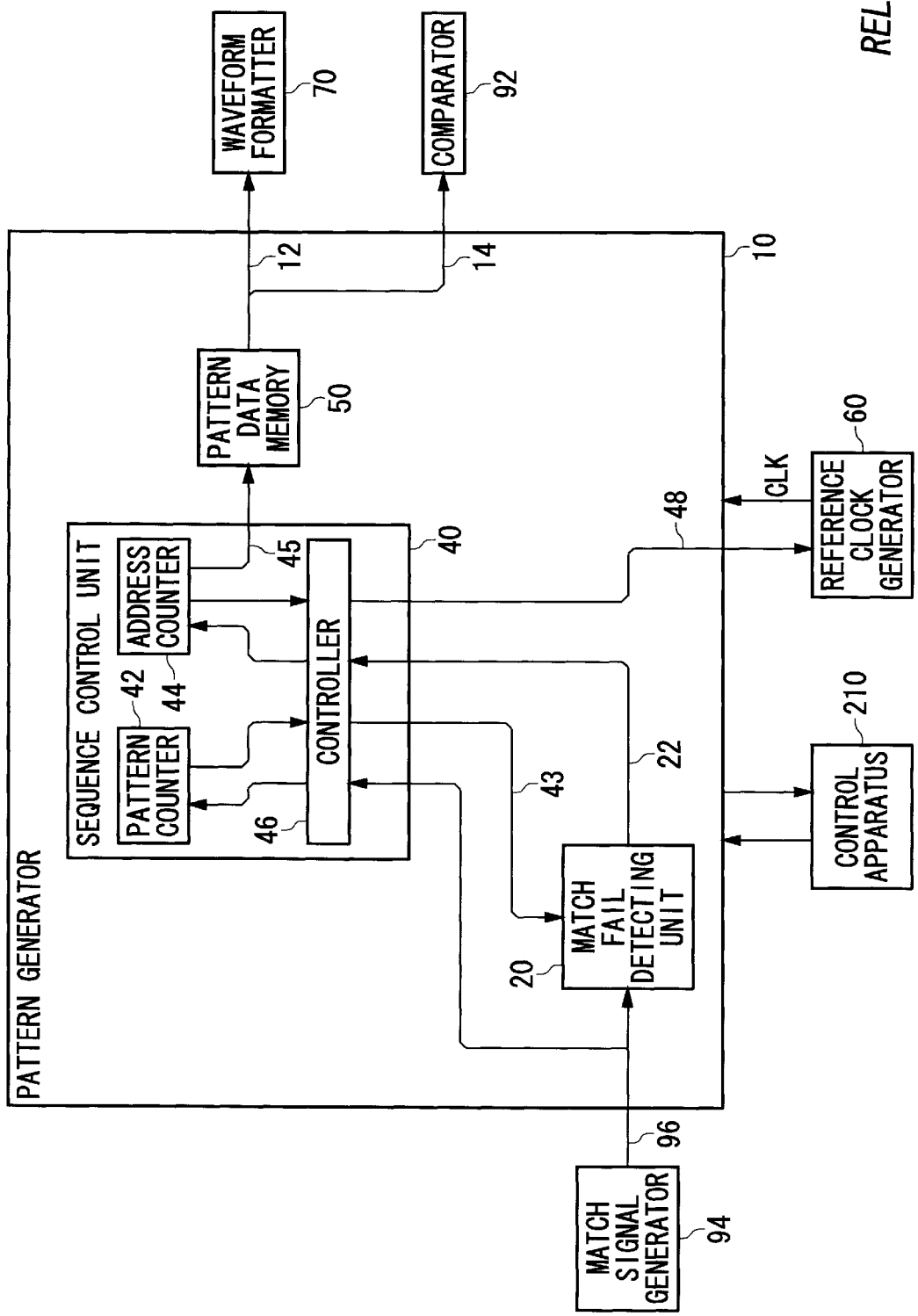
FIG. 1 is a block diagram that shows a configuration of a pattern generator 10 of a conventional semiconductor device testing apparatus.
Figure 2:
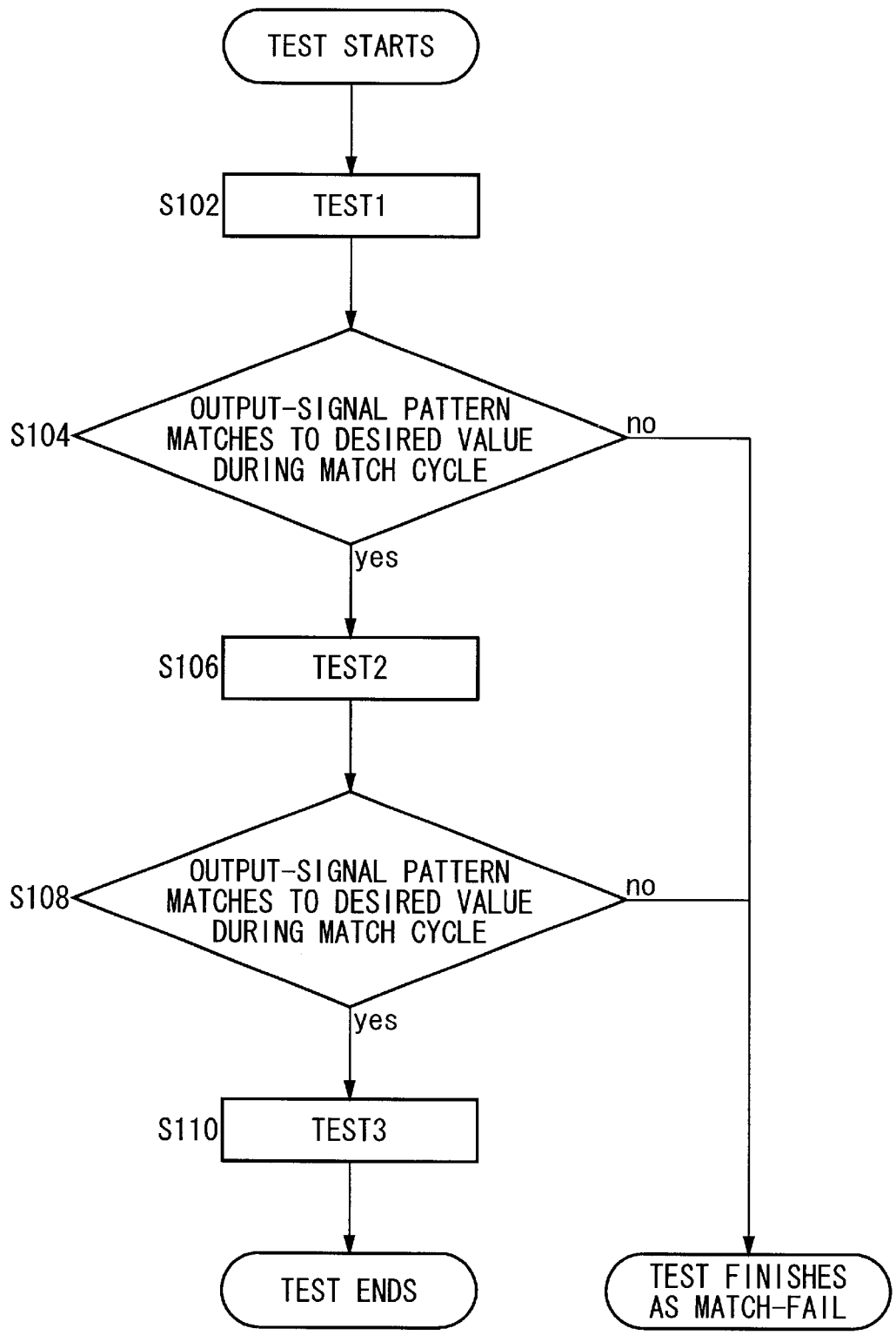
FIG. 2 is a flow chart that shows a process for testing one semiconductor device using a conventional semiconductor device testing apparatus.
Figure 3:
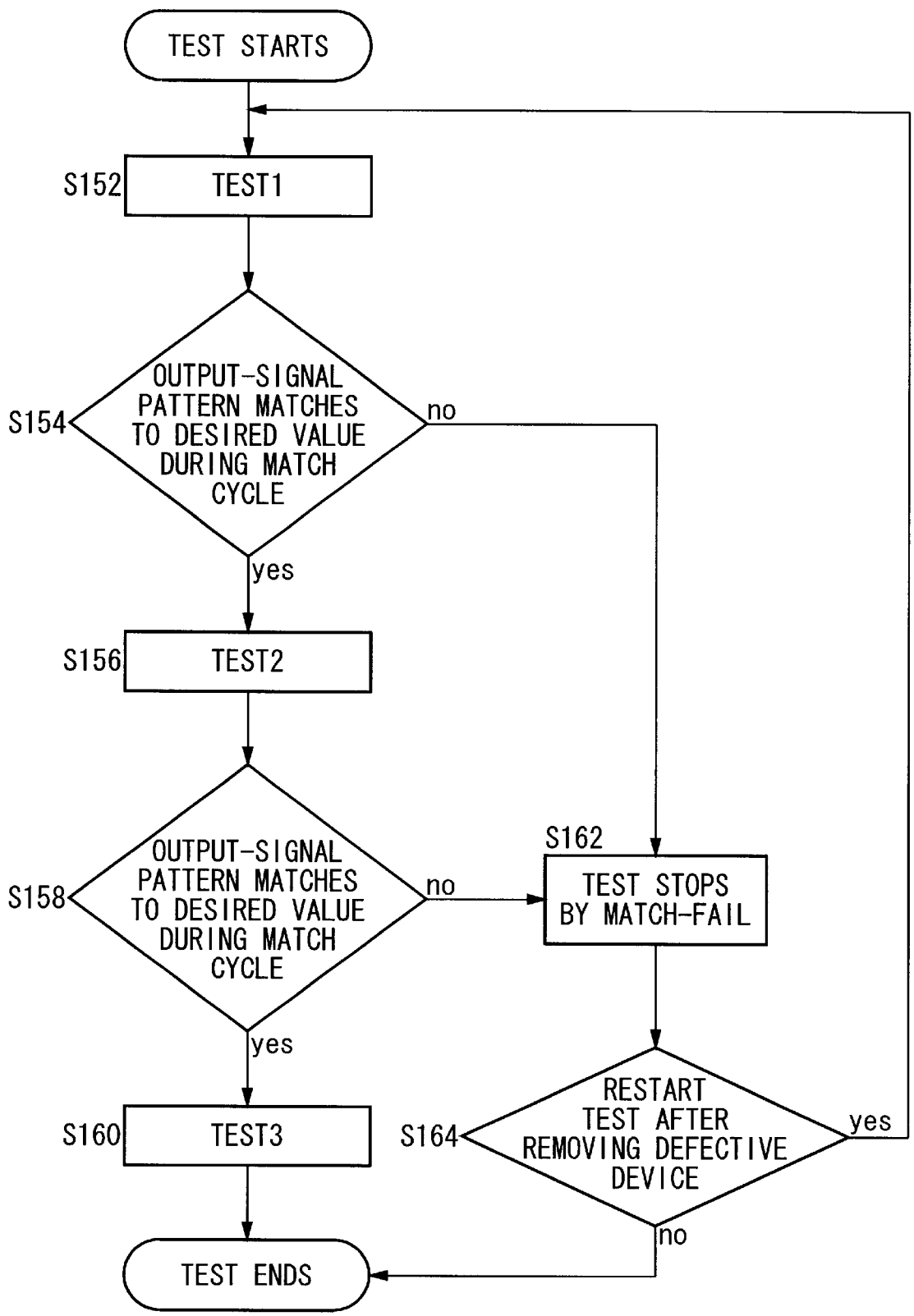
FIG. 3 is a flow chart that shows a process for testing a plurality of semiconductor devices at the same time using a conventional semiconductor device testing apparatus.
Figure 4:
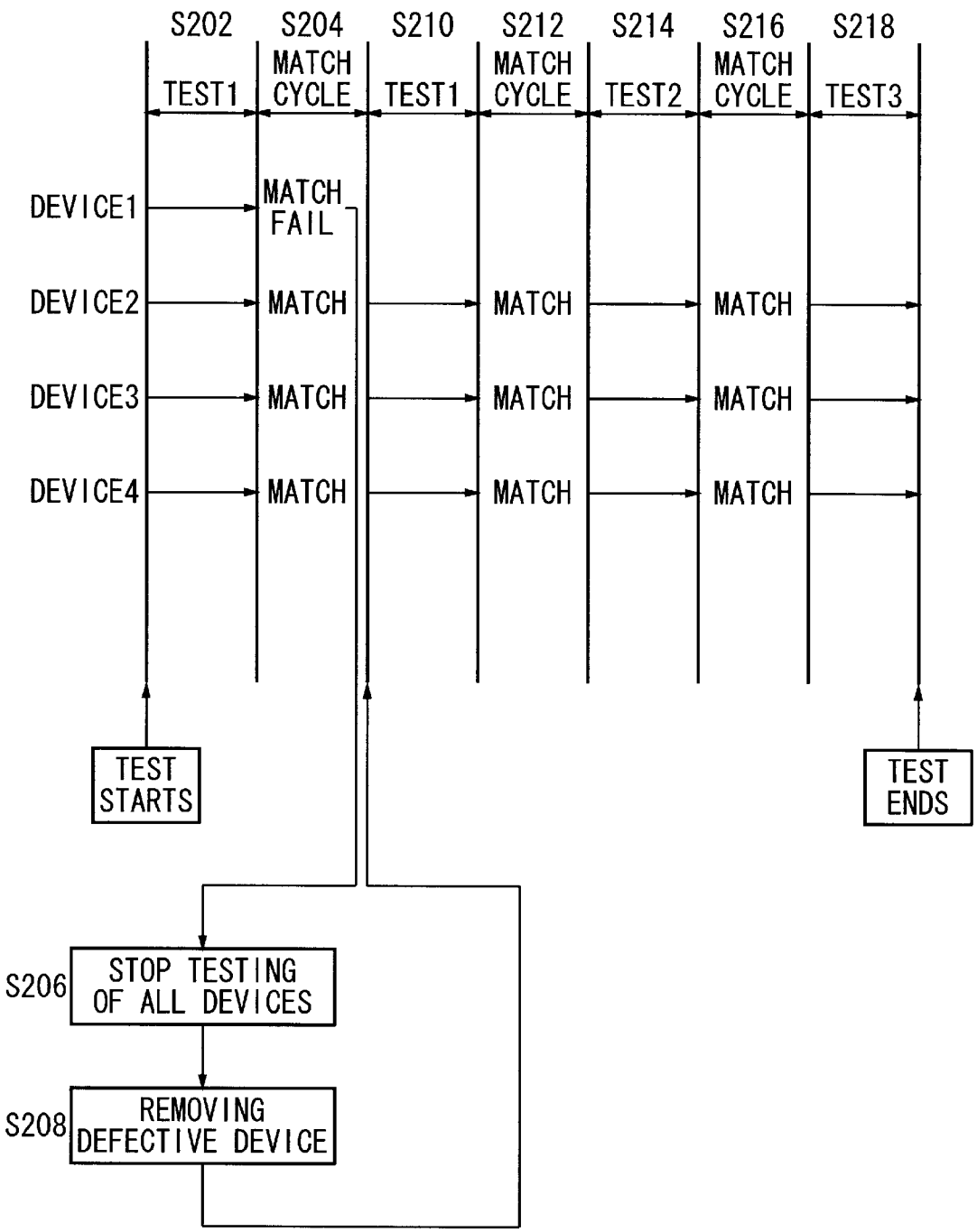
FIG. 4 is a time chart that shows a process for testing a plurality of semiconductor devices at the same time using a conventional semiconductor device testing apparatus.
Figure 5:
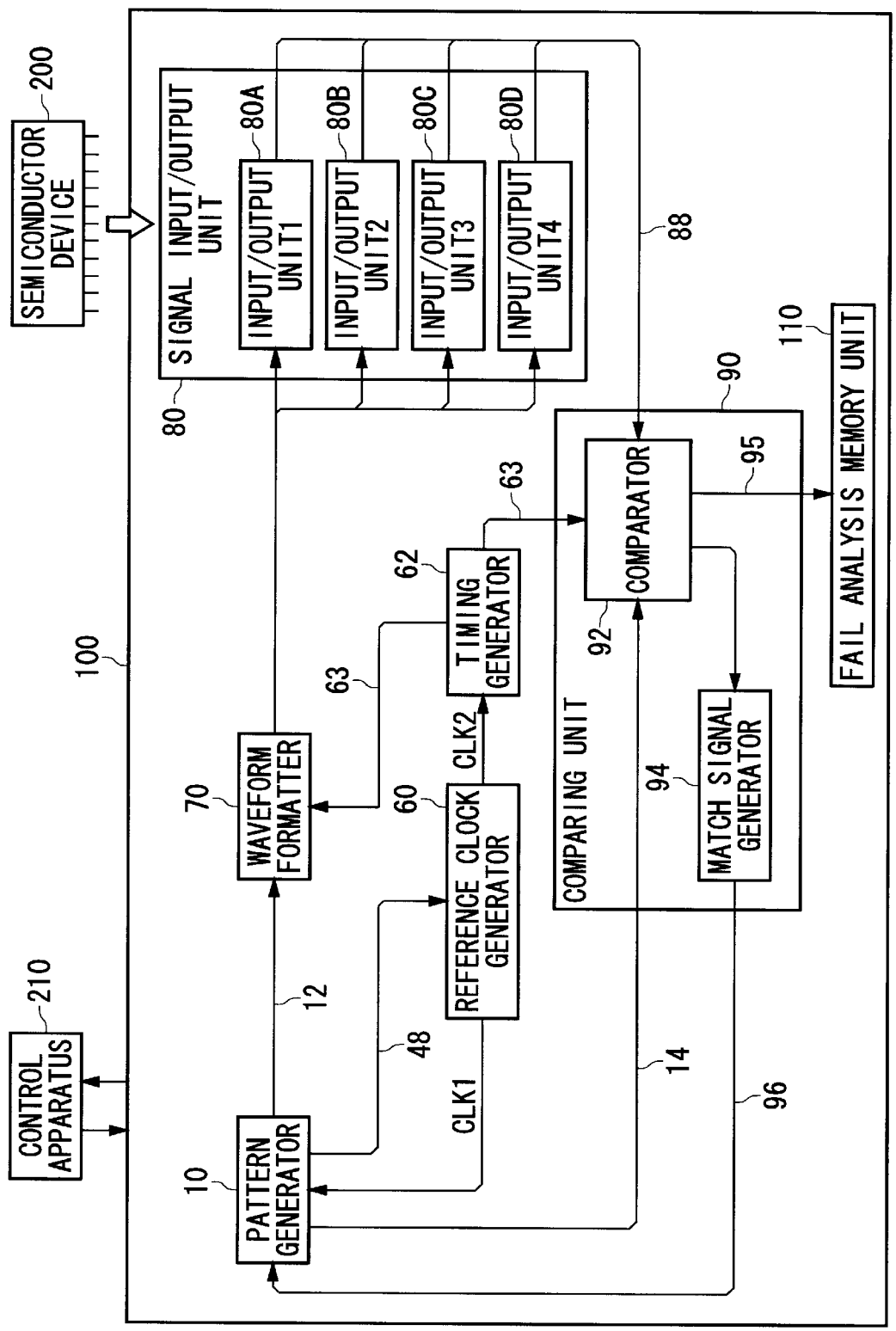
FIG. 5 is a block diagram that shows a configuration of a first embodiment of a semiconductor device testing apparatus 100.

FIG. 5 is a block diagram that shows a configuration of a first embodiment of a semiconductor device testing apparatus 100. As shown in FIG. 5, the semiconductor device testing apparatus 100 has a pattern generator 10, a reference clock generator 60, a timing generator 62, a waveform formatter 70, a signal input/output unit 80, a comparing unit 90, and a fail analysis memory unit 110.

The semiconductor device testing apparatus 100 is used for testing a logic IC such as a system LSI. In particular, the semiconductor device testing apparatus 100 can test a plurality of semiconductor devices 200 at the same time. If the system LSI contains a built-in flush memory, a test pattern has to be applied continuously to a system LSI for a predetermined number of times.

This is because of the characteristic of a flush memory that the data cannot be written into the flush memory unless the data is applied to the flush memory for a predetermined number of times. The number of times of applying the data into the flush memory required for writing the data into the flush memory is determined by the standard of a flush memory. Usually, the number of times of applying the data into the flush memory of the standard is greater than the number of times of applying the data that is actually needed. For example, even if the data can be written into the flush memory by applying the data to the flush memory about 20 times, the standard of the number of times of applying the data to the flush memory may be set as 100 times.

To test a plurality of flush memories described above, the number of times of applying the data is set to 20 times for all the flush memories in order to reduce the test time, and the test is continued for the remaining flush memories after removing the flush memory, to which the writing of the data is failed, from the test object. The flush memory, which is removed from the test object, may be tested separately with other flush memories by applying data 30 times, for example.

In this way, when the plurality of the semiconductor devices 200 are tested at the same time, the test proceeds while confirming whether the writing of the input-signal pattern 12 into the semiconductor device 200 and the reading of the output-signal pattern 88 from the semiconductor device 200 are normally finished for all the semiconductor devices 200. Therefore, a series of tests are divided into several steps, and it is confirmed whether the reading or writing of the data into or from the semiconductor device 200 is finished within the match cycle. The match cycle is a predetermined time period between each of the steps.

If the output-signal pattern 88 does not match the expected value during the match cycle, the match-failed device of one of the plurality of semiconductor devices 200 is removed from the test object after stopping the test. Then, the test is continued.

The pattern generator 10 generates an input-signal pattern 12 and an expectation value signal pattern 14 according to a predetermined control sequence. The input-signal pattern 12 is a pattern to be applied to the semiconductor device 200, which is an object to be tested. The expectation value signal pattern 14 is a pattern to be output from the semiconductor device 200 when the input-signal pattern 12 is applied to the semiconductor device 200. The pattern generator 10 is expressed as a test signal supplying apparatus in the claims.

The reference clock generator 60 outputs a clock signal CLK1 to the pattern generator 10 and outputs a clock signal CLK2 to the timing generator 62. The reference clock generator 60 is controlled based on a clock control signal 48 that is output from the pattern generator 10. The timing generator 62 generates a timing signal 63 at various timings based on the clock signal CLK2. The timing signal 63 controls the timing of applying the input-signal pattern 12 into the semiconductor device 200.

The waveform formatter 70 formats the waveform of the input-signal pattern 12 based on the timing signal 63 so that the waveform of the input-signal pattern 12 matches the characteristics of each of the semiconductor devices 200. The waveform formatter 70 further controls the application of the input-signal pattern 12 to the semiconductor device 200 based on the timing signal 63.

When the pattern generator 10 outputs the clock control signal 48 to the reference clock generator 60, the output of the clock signal CLK2 from the reference clock generator 60 to the timing generator 62 is stopped, and the output of the timing signal 63 from the timing generator 62 is also stopped. Then, the waveform formatter 70 stops applying the input-signal pattern 12 into the semiconductor device 200.

In the present embodiment, four signal input/output units 80A, 80B, 80C, and 80D are comprised in the signal input/output unit 80. A semiconductor device 200 is inserted into each of the signal input/output units 80A, 80B, 80C, and 80D. Each signal input/output unit 80A, 80B, 80C, and 80D receives a formatted input-signal pattern from the waveform formatter 70 and applies this to the input pins of each of the semiconductor devices 200, respectively. Each signal input/output unit 80A, 80B, 80C, and 80D further receives an output-signal pattern 88 from the output pins of each of the semiconductor devices 200 and outputs this to the comparator 92. The signal input/output unit 80 may be an insert slot, into which the semiconductor device 200 can be inserted, for example.

In the present embodiment, four signal input/output units 80A, 80B, 80C, and 80D are provided as a signal input/output unit 80 so that four semiconductor devices 200 can be tested at the same time. However, the number of signal input/output units 80 and semiconductor devices 200 can be set to a number other than four. Furthermore, not only a plurality of semiconductor devices 200, but also a single semiconductor device 200 may be tested alone.

The comparing unit 90 receives the output-signal pattern 88 from the signal input/output unit 80 and receives the expectation value signal pattern 14 from the pattern generator 10. The comparing unit 90 then compares the output-signal pattern 88 and the expectation value signal pattern 14 based on the timing signal 63, which is output from the timing generator 62. Then, the comparing unit 90 outputs a match signal 96 when the output-signal pattern 88 matches the predetermined value, which is determined based on the output-signal pattern 88 and the expectation value signal pattern 14.

The comparing unit 90 includes a comparator 92 and a match signal generator 94. The comparator 92 includes an exclusive-OR circuit. The comparator 92 receives the output-signal pattern 88 and the expectation value signal pattern 14. The comparator 92 then compares the output-signal pattern 88 with the expectation value signal pattern 14 logically based on the timing signal 63 output from the timing generator 62.

Each output signal pattern 88 output from each semiconductor device 200 contains a 1-bit match bit which indicates that either the writing process of the input signal pattern 12 or the readout process of the output signal pattern 88 has been completed in the normal manner. A particular bit location of the match bit in the output signal pattern 88 depends on the type of test and the semiconductor device 200 itself, and the particular bit location of the match bit is judged by the comparator 92 based on the expectation value signal pattern 14.

The comparator 92 outputs the signal to the match signal generator 94, the signal of which shows whether the match bit contained in each output-signal pattern 88 matches the predetermined value that is determined based on the expectation value signal pattern 14. The match signal generator 94 outputs one bit of a match signal 96 when the match bit of all the output-signal patterns 88 match the predetermined value. Here, in the present embodiment, one bit of the match signal 96 is output relative to all the output-signal patterns 88. However, one bit of the match signal 96 may be output for each of the output-signal patterns 88, respectively.

When the output-signal pattern 88 does not match the expectation value signal pattern 14, the comparator 92 outputs a fail signal 95 to the fail analysis memory unit 110. The fail signal 95 is stored into the fail analysis memory unit 110. The fail analysis memory unit 110 analyzes where the defective portion is within the semiconductor device 200 based on the fail signal 95 stored in the fail analysis memory unit 110. Furthermore, the control apparatus 210 controls each unit of the semiconductor device testing apparatus 100.

Figure 6:
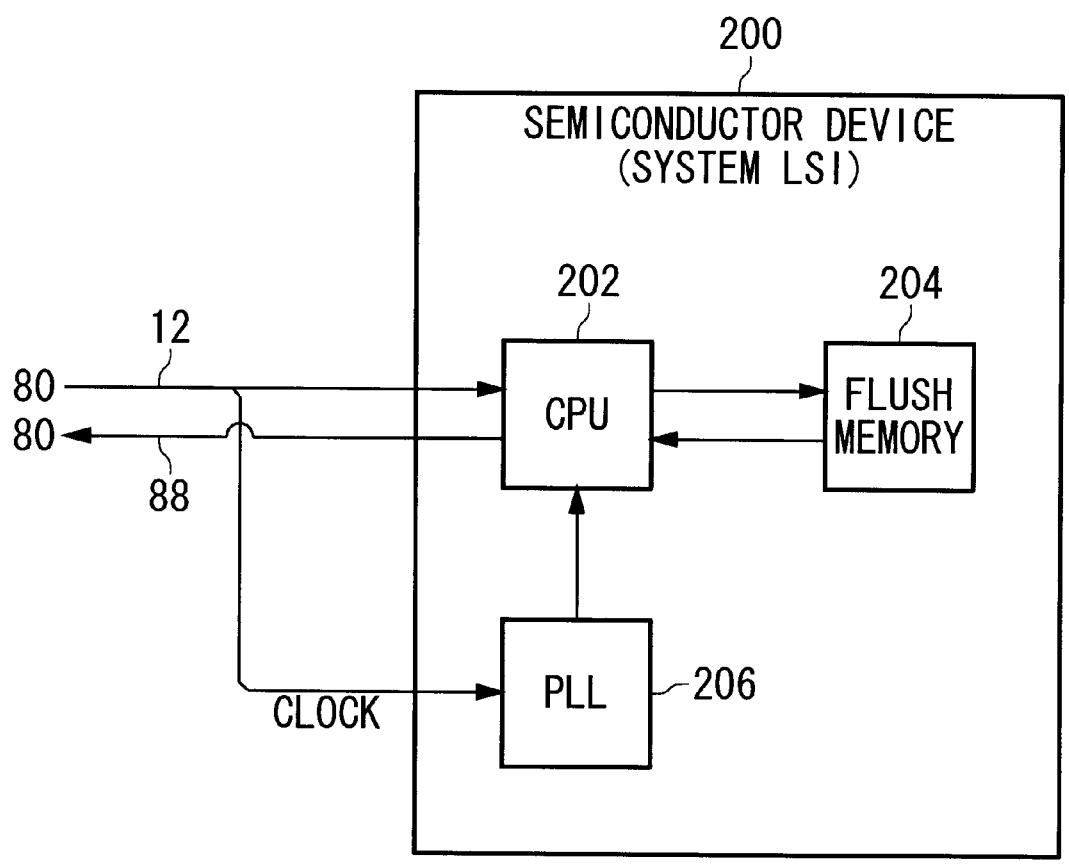
FIG. 6 shows a system LSI that is one example of the semiconductor device 200, which is an object to be tested.

FIG. 6 shows a system LSI that is one example of the semiconductor device 200, which is an object to be tested. As an example of a system LSI, there is a system LSI that contains a built-in flush memory or a system LSI that contains a built-in PLL device.

The semiconductor device 200 of the present embodiment includes a CPU (central processing unit) 202, a flush memory 204, and a PLL device 206. Because data cannot be directly written into or read out from the built-in flush memory 204 contained inside the system LSI, the input-signal pattern 12 is applied to the flush memory 204 through the CPU 202 by providing a CPU control signal to the CPU 202 to make the flush memory 204 output the output-signal pattern 88 through the CPU 202.

If the test for the system LSI that contains the built-in flush memory 204 is stopped halfway and restarted again from the beginning, the input-signal pattern 12 is applied to the flush memory repeatedly so that the data is excessively written into the flush memory. However, because the flush memory will be destroyed if the data is written into the flush memory 204 excessively, the test has to be started from the point where the test is stopped when the test for the system LSI that contains a built-in flush memory 204 is stopped halfway and restarted again. Thus, in the present embodiment, the data of a restart address is retained so that restarting of the test from the point when the test stops becomes possible using the restart address, as explained below.

Furthermore, to test the system LSI that contains the PLL device 206, it is required to lock the PLL device 206 by previously applying a clock signal to the PLL device 206 before starting the test. Therefore, if the clock signal is stopped when the test is stopped, we have to wait until the PLL device 206 is locked while applying the clock signal again to the PLL device 206 for each restarting of the test. Thus, in the present embodiment, the clock signal is applied to the PLL device 206 continuously so that restarting of the test without waiting for the PLL device 206 to be locked becomes possible, as explained below.

Figure 7:
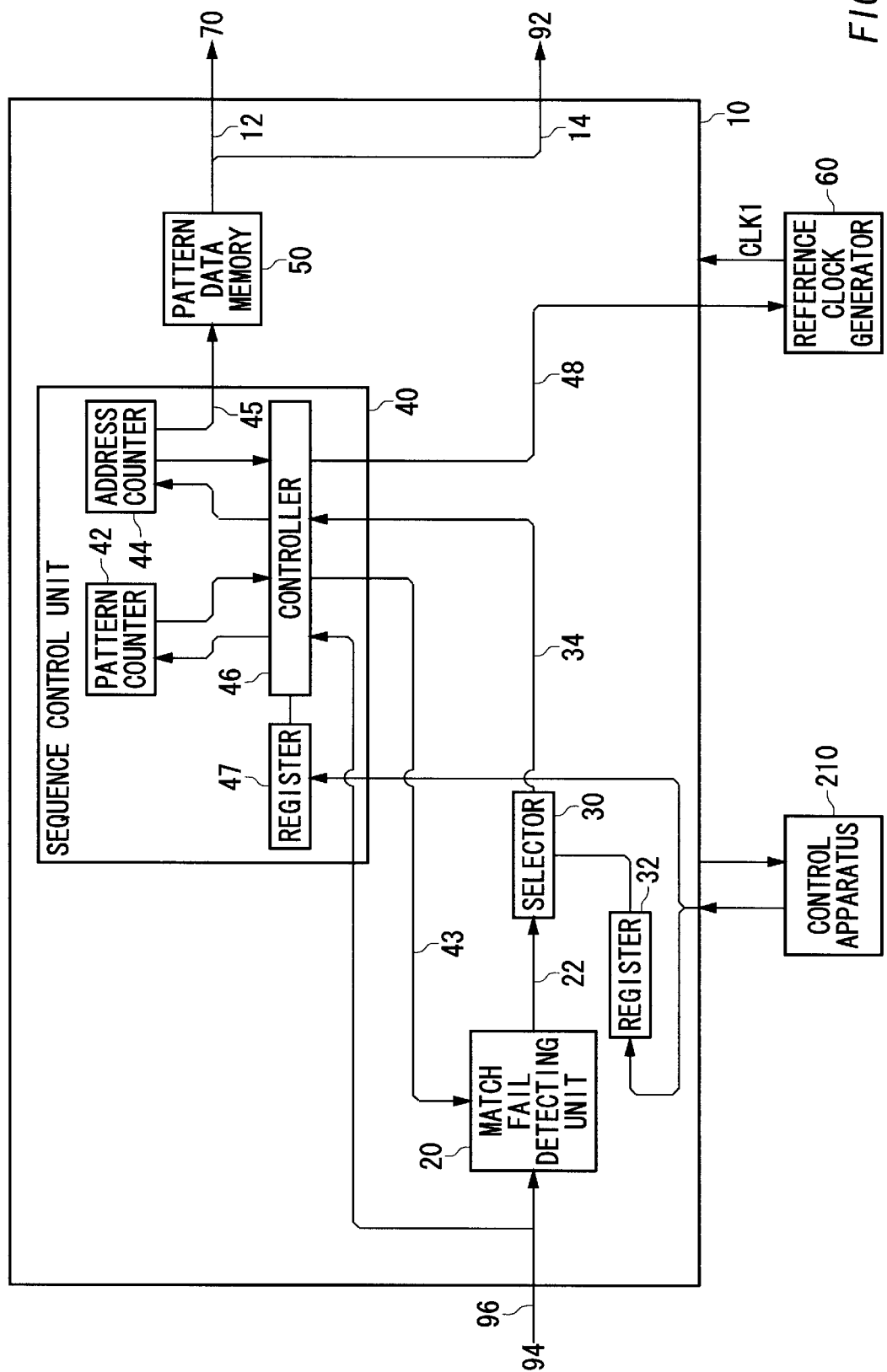
FIG. 7 shows a configuration of the pattern generator 10.

FIG. 7 shows a configuration of the pattern generator 10. As shown in FIG. 7, the pattern generator 10 has a sequence control unit 40, a pattern data memory 50, a match-fail detecting unit 20, a fail mode selector 30, and a fail mode register 32.

The pattern data memory 50 stores the data of the input-signal pattern 12 and the expectation value signal pattern 14.

The sequence control unit 40 makes the pattern data memory 50 generate the input-signal pattern 12 and the expectation value signal pattern 14 by outputting an address signal 45 to the pattern data memory 50. Furthermore, the sequence control unit 40 receives the match signal 96 from the match signal generator 94. The match-fail detecting unit 20 outputs the match-fail signal 22 to the fail mode selector 30 when the match-fail occurs. The match-fail occurs when the match signal 96 does not become active during the match cycle when waiting for the match signal 96.

The fail mode selector 30 outputs a fail mode signal 34 when the fail mode selector 30 receives the match-fail signal 22 from the match-fail detecting unit 20 based on the set value of the fail mode register 32. The fail mode signal 34 indicates a method for controlling the sequence control unit 40 when the match-fail occurs.

The sequence control unit 40 includes a pattern counter 42, an address counter 44, a controller 46, and a restart address register 47.

The pattern counter 42 counts the match cycles. The address counter 44 counts the addresses of the control sequence. The controller 46 controls the pattern counter 42 and the address counter 44 according to the predetermined control sequence. The controller 46 receives the match signal 96 from the match signal generator 94 and outputs a match cycle signal 43 to the match-fail detecting unit 20. The match cycle signal 43 informs the match-fail detecting unit 20 that the match-fail detecting unit 20 is in the match cycle process. The controller 46 further receives the fail mode signal 34 from the fail mode selector 30.

Furthermore, the controller 46 outputs the clock control signal 48 to the reference clock generator 60 based on the fail mode signal 34. The clock control signal 48 stops generation of the clock signal generated by the reference clock generator 60. A restart address for restarting the stopped control sequence is set to the restart address register 47. In the present embodiment, the address next to the address, at which the test is stopped, is set to the restart address register 47 as a restart address.

As a method for processing the control sequence of the sequence control unit 40 when the match-fail occurs, there is a fail stop process, a fail hold process, and a fail burst process. The fail stop process ends the testing process. The fail hold process restarts the test from the restart address after the test is stopped. The fail burst process applies the same input-signal pattern 12 repeatedly to the semiconductor device 200 while the test is stopped. The methods of the fail stop process, the fail hold process, and the fail burst process are stored in the fail mode register 32 so that any one of the fail stop process, the fail hold process, and the fail burst process is selected from the fail mode register 32 by the fail mode selector 30.

During the fail stop process, the controller 46 stops generation of the address signal 45 by controlling the address counter 44 to stop the generation of the input-signal pattern 12 and the expectation value signal pattern 14 when the match-fail occurs. The controller 46 further outputs the clock control signal 48 to the reference clock generator 60 to stop the application of the input-signal pattern 12 to the semiconductor device 200. In this case, the test has to be started from the beginning in order to restart the stopped test.

During the fail hold process, the output of the address signal is stopped the same as in the fail stop process. However, the clock control signal 48 is output from the controller 46. To restart the stopped test, the control sequence is restarted from the restart address that is set to the restart address register 47. Therefore, the time taken for the test can be reduced. Furthermore, the fail hold process does not apply the input-signal pattern 12 repeatedly to the semiconductor device 200 so that the fail hold process does not destroy a system LSI having a built-in flush memory 204.

During the fail burst process, the output of the address signal 45 is stopped so that the generation of the input-signal pattern 12 and the expectation value signal pattern 14 is stopped when the match-fail occurs. At the same time, the same input-signal pattern 12 is repeatedly applied to the semiconductor device 200.

Because the controller 46 does not output the clock control signal 48, the timing generator 62 that receives the clock signal CLK2 from the reference clock generator 60 continuously outputs a timing signal 63. Thus, the waveform formatter 70 that receives the timing signal 63 output from the timing generator 62 repeatedly applies the same input-signal pattern 12 to the semiconductor device 200. To restart the stopped test, the control sequence is restarted from the restart address that is set to the restart address register 47. Therefore, even when the test for a system LSI that contains a built-in PLL device 206, the clock signal can be applied to the system LSI continuously so that no time is taken waiting for the PLL device 206 to be locked. Thus, the time taken for the test can be reduced.

Figure 8:
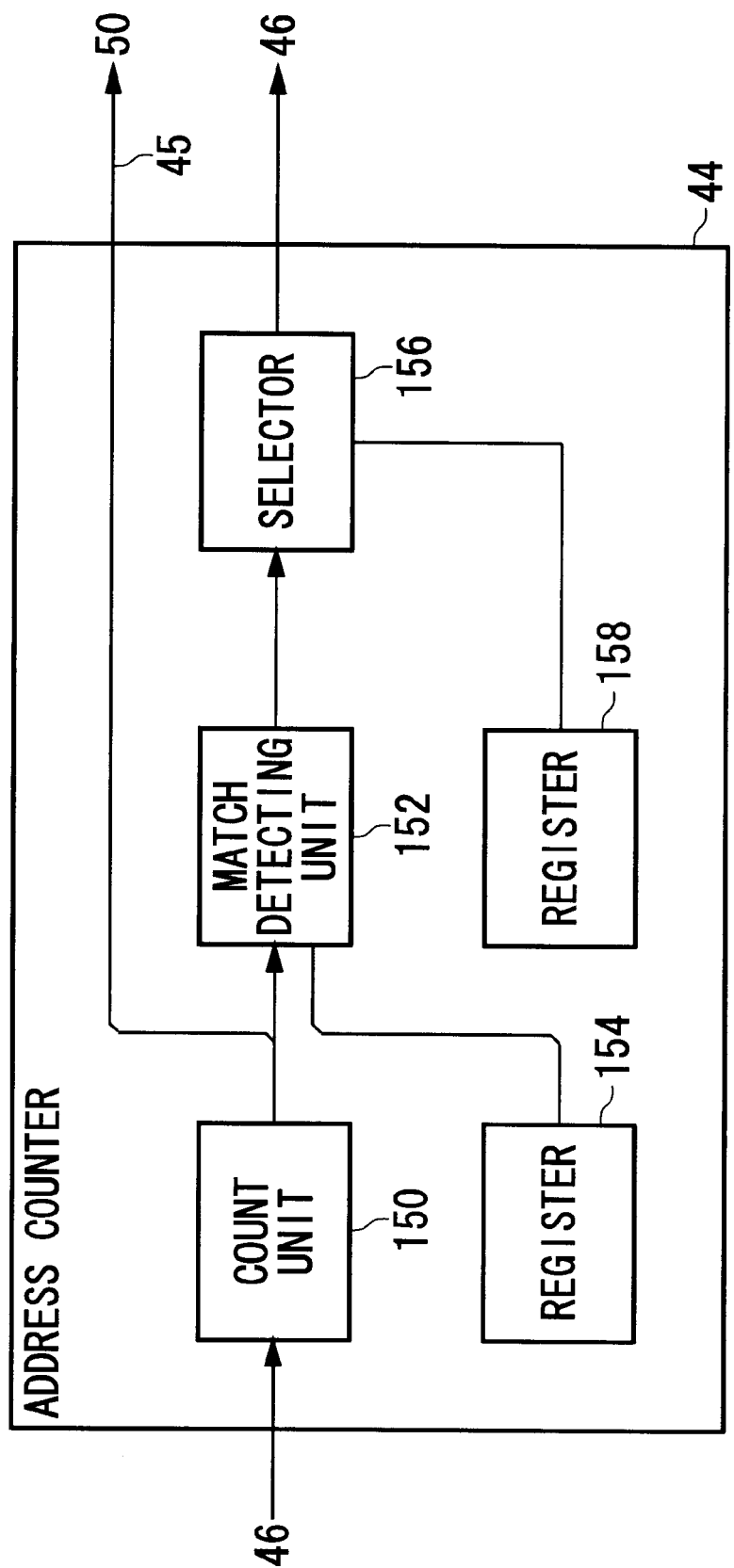
FIG. 8 shows a configuration of an address counter 44.

FIG. 8 shows a configuration of an address counter 44. As shown in FIG. 8, the address counter 44 includes a count unit 150, a match-detecting unit 152, a match detecting register 154, a mode selector 156, and a mode register 158.

The address counter 44 is mainly used for a DC parametric test that measures an electric current and voltage characteristic of the semiconductor device 200. The electric current and voltage characteristic of the semiconductor device 200 is measured by changing an electric current or voltage after setting the pin, of the semiconductor device 200 which is to be measured, to a predetermined condition. To set the pin of the semiconductor device 200, which is to be measured to a predetermined condition, a control sequence for applying the input-signal pattern 12 to the semiconductor device 200 is proceeded until the control sequence reaches the address at which the pin of the semiconductor device 200 becomes the predetermined condition. Then, the control sequence is stopped at the address at which the pin of the semiconductor device 200 becomes the predetermined condition.

The count unit 150 counts an address of the control sequence of the sequence control unit 40 and outputs an address signal 45 to the match-detecting unit 152. Furthermore, the count unit 150 outputs an address signal 45 to the pattern data memory 50. The address of the control sequence, at which the pin of the semiconductor device 200, which is to be measured, becomes the predetermined condition, is set to the match detecting register 154.

The match-detecting unit 152 compares the address signal received from the count unit 150 and the address that is set to the match detecting register 154 and outputs a match signal to the mode selector 156 when the address signal received from the count unit 150 and the address set to the match detecting register 154 matches. The mode selector 156 that receives the match signal outputs a control signal to the controller 46 based on the set value of the mode register 158.

Any one of the process sequences of a stop process, a hold process, or burst process is set to the mode register 158 as a method for controlling the control sequence of the controller 46. The stop process stops the control sequence. The hold process restarts the test from the address next to the address at which the control sequence is stopped. The burst process stops the control sequence, and at the same time, the burst process repeatedly applies the same input-signal pattern 12 to the semiconductor device 200.

During the stop process, the controller 46 stops the output of the address signal 45 from the count unit 150. The controller 46 outputs the clock control signal 48 to the reference clock generator 60 in order to stop the generation of the input-signal pattern 12 and the expectation value signal pattern 14. Therefore, the application of the input-signal pattern 12 to the semiconductor device 200 is stopped. The test has to be started from the beginning sequence to restart the control sequence.

During the hold process, the output of the address signal 45 by the count unit 150 is stopped. The controller 46 outputs the clock control signal 48 to stop the generation of the input-signal pattern 12 and the expectation value signal pattern 14. Therefore, the application of the input-signal pattern 12 to the semiconductor device 200 is stopped. To restart the control sequence, the control sequence is restarted from the address next to the address that is set to the match detecting register 154. Therefore, the time taken for the test can be reduced. Furthermore, the hold process does not repeatedly apply the input-signal pattern 12 to the semiconductor device 200 so that the hold process does not destroy a system LSI having a built-in flush memory 204.

During the burst process, the output of the address signal 45 from the count unit 150 is stopped. At the same time, the same input-signal pattern 12 is repeatedly applied to the semiconductor device 200. To restart the control sequence, the control sequence is restarted from the address next to the address that is set to the match detecting register 154. Therefore, even when the test for a system LSI that contains a built-in PLL device 206 is stopped, the clock signal can be applied to the system LSI continuously so that no time is taken waiting for the PLL device 206 to be locked. Thus, the time taken for the test can be reduced.

The pattern counter 42 has the same configuration with the address counter 44 shown in FIG. 8 except that the count unit 150 of the address counter 44 outputs the address signal 45 to the pattern data memory 50. The pattern counter 42 processes the control sequence the same as the address counter 44 when the pattern counter 42 counts patterns.

Figure 9:
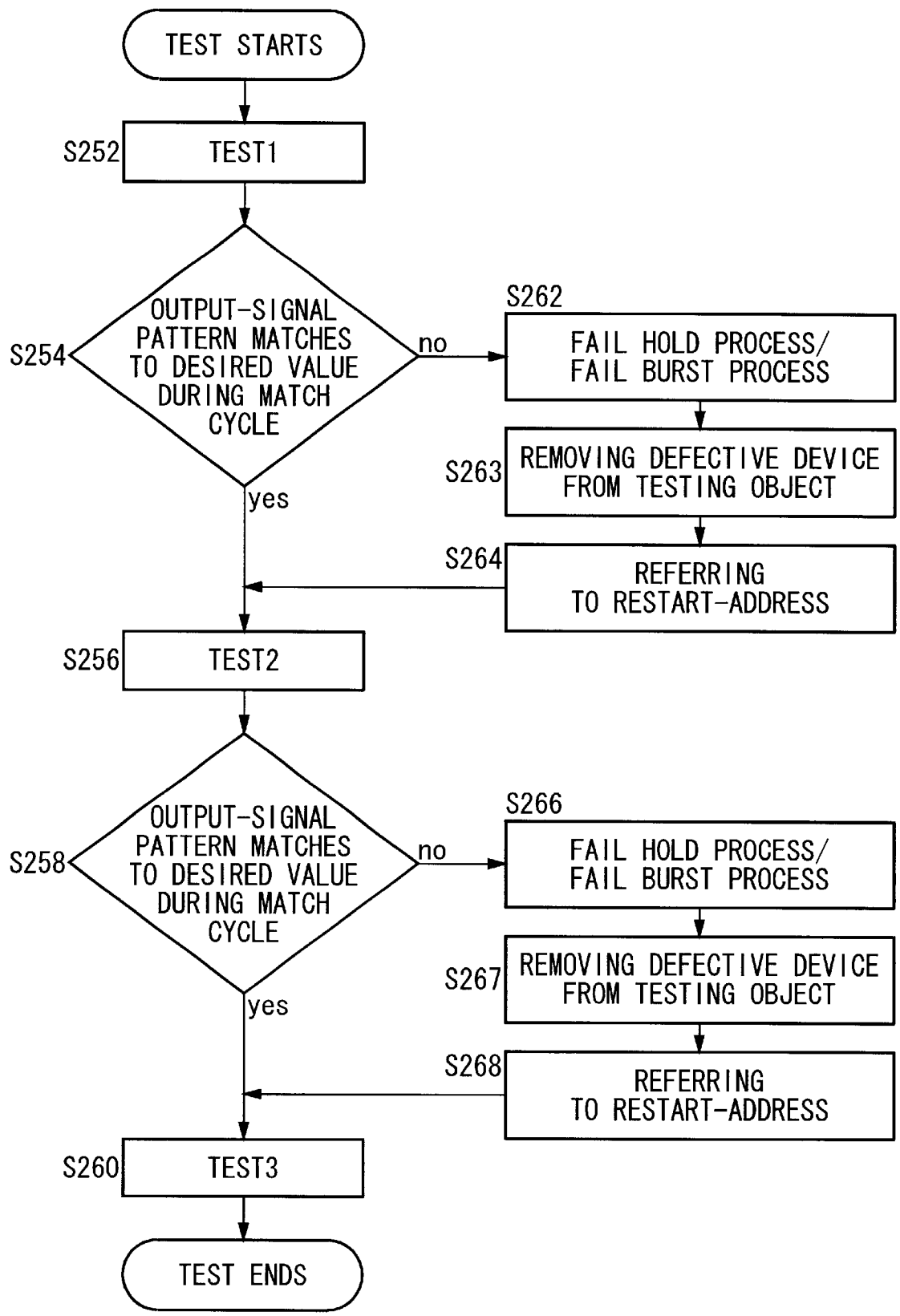
FIG. 9 is a flow chart that shows a process for testing a plurality of semiconductor devices 200 at the same time.

FIG. 9 is a flow chart that shows a process for testing a plurality of semiconductor devices 200 at the same time. As shown in FIG. 9, after a test 1 (S252) is performed, a test 2 (S256) is performed when the output-signal pattern 88 matches the predetermined value that is determined based on the expectation value signal pattern 14 during the match cycle (S254).

When the output-signal pattern 88 does not match the predetermined value that is determined based on the expectation value signal pattern 14 during the match cycle (S254), the test is stopped at that point as a match-fail (S262). Then, the address next to the stop address is set to the restart address register 47 as a restart address.

The fail mode selector 30 selects any one of the process sequences among the fail stop process, the fail hold process, and the fail burst process based on the set value of the fail mode register 32 (S262). The semiconductor device 200 that becomes match-fail is removed from the test object (S263). Then, the controller 46 refers to the restart address that is set to the restart address register 47 when the test is restarted for the other remaining devices (S264). The controller 46 restarts the test from the test 2 based on this restart address (S256).

Next, the process for the match cycle (S266, S267, S268) that is the same with the process for the match cycle after the test 1 (S254, S262, S263, and S264) is performed when the output-signal pattern 88 does not match the predetermined value, which is determined based on the expectation value signal pattern 14 during the match cycle (S258) that is performed after the test 2 (S256). If the test 3 (S260) is finished, all the test processes end.

Figure 10:
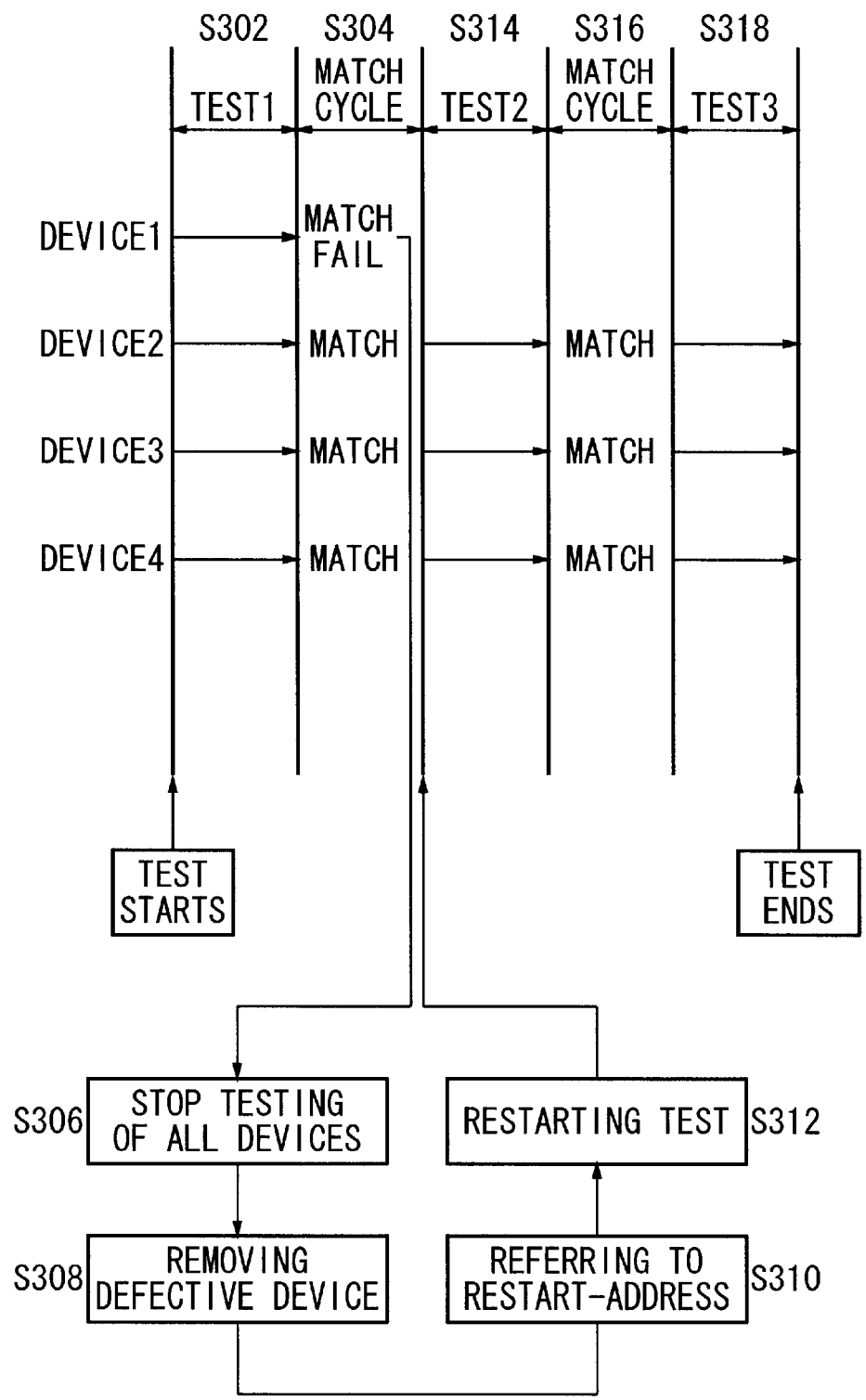
FIG. 10 is a flow chart that shows a process for testing a plurality of semiconductor devices 200 at the same time.

FIG. 10 is a flow chart that shows a process for testing a plurality of semiconductor devices 200 at the same time. As shown in FIG. 10, after the test 1 is performed (S302), whether the output-signal pattern 88 matches the predetermined value is judged for a plurality of semiconductor devices 200 at the match cycle (S304). If any one of the semiconductor devices 200 causes the match-fail, the test for all the devices is stopped (S306). Then, the address next to the stop address is set to the restart address register 47 as a restart address.

Next, the semiconductor device 200 that causes the match-fail is removed from the test object (S308). Next, the controller 46 refers to the restart address that is set to the restart address register 47 when the test is restated for the other remaining semiconductor devices 200 (S310). The test is restarted from the test 2 based on this restart address (S312). If the match-fail does not occur at the match cycle (S316) after the test 2 (S314), the test 3 (S314) is performed. Then, all the processes of the test end when the test 3 finishes.

FIGS. 11A–11B shows a control sequence of the sequence control unit 40, and a corresponding input signal pattern 12 and expectation value signal pattern 14 that are stored into the pattern data memory 50. FIG. 11A shows a control sequence of the sequence control unit 40. FIG. 11B shows the data stored in the pattern data memory 50. The input-signal pattern 12 and the expectation value signal pattern 14 are output from each of the pins of pin 1 to pin 32 of the pattern data memory 50 for three bits according to the address signal 45 input from the address counter 44.

Each of the three bits of data from 000 to 111 indicate a specific meaning. For example, the data of 000 indicates data 0. The data of 001 indicates data 1. The data of 010 indicates P (positive clock). The data of 011 indicates N (negative clock). The data of 100 indicates L (low level). The data of 101 indicates H (high level). The data of 110 indicates Z (High Z). The data of 111 indicates X (out of comparison object).

First, the addresses from #0000 to #0020 are the addresses for the test1 for inputting the input-signal pattern 12. The addresses from #0021 to #0030 are addresses for the match cycle that form a loop in which an address jumps from #0030 to #0021. In the present embodiment, this loop is repeated 100 times. During this match cycle, whether the predetermined bits within the expectation value signal pattern 14 matches the predetermined value is judged as shown in the right hand column of FIG. 11B. If the predetermined bits within the expectation value signal pattern 14 matches the predetermined value, the address jumps to the address #0031. If the predetermined bits within the expectation value signal pattern 14 do not match the predetermined value, the test is stopped as match-fail.

The addresses from #0031 to #0050 are addresses for the test 2 for applying the input-signal pattern 12 to the semiconductor device 200. Then, the loop for the match cycle from the addresses #0051 to #0060 is repeated 100 times. If the predetermined bits within the expectation value signal pattern 14 matches the predetermined value, the address jumps to address #0061. If the predetermined bits within the expectation value signal pattern 14 do not match the predetermined value, the test is stopped.

Figure 12:
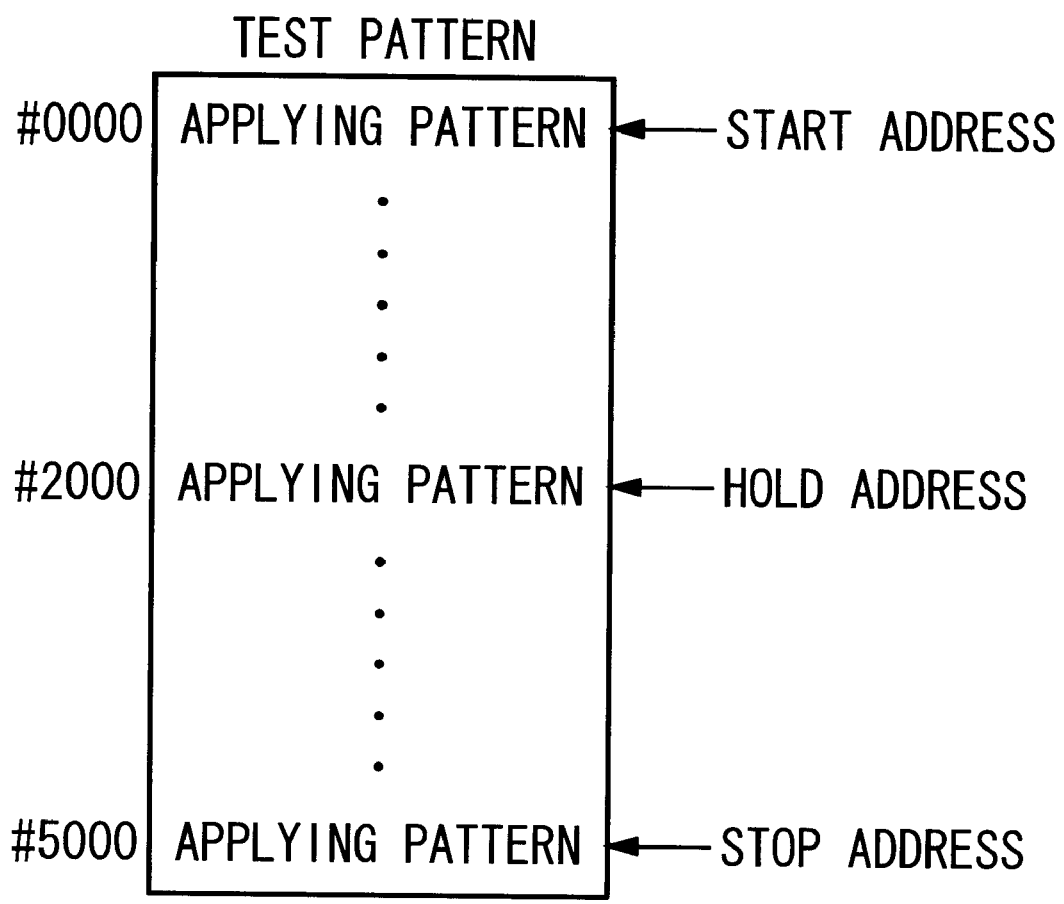
FIG. 12 shows a control sequence of the address counter 44 shown in FIG. 8.

FIG. 12 shows a control sequence of the address counter 44 shown in FIG. 8. The address #0000 is a start address. To perform the stop process, the address of #5000 is set to the match detecting register 154 as a stop address. To perform the hold process or the burst process, the address #2000 is set to the match detecting register 154 as the hold address or the burst address.

In case the input-signal pattern 12 is applied to the semiconductor device 200 from the address #0000, and the address #2000 is set as the hold address or the burst address, the match detecting unit 152 detects that the present address matches the address set to the match detecting register 154 when the control sequence proceeds to the address #2000. Then, the mode selector 156 outputs the control signal for the hold process or the burst process.

In case the address #5000 is set as the stop address, the match-detecting unit 152 detects that the present address matches the address set to the match detecting register 154 when the control sequence proceeds to the address #5000. Then, the mode selector 156 outputs the control signal for the stop process.

Here, the control sequence of the pattern counter 42 is processed the same as the control sequence of the address counter 44 shown in FIG. 12☐

According to the present embodiment, a plurality of semiconductor devices 200 can be tested at the same time in a short time. Even when the test for all the semiconductor devices 200 is stopped because the match-fail occurs for one semiconductor device 200 during the match cycle, the present embodiment can remove the semiconductor device 200 that causes the match-fail from the test object and restart the test for the remaining semiconductor devices 200 from the address next to the address, at which the test is stopped. Thus, the present embodiment can reduce the time taken for the test as a whole.

Furthermore, the present embodiment can restart the test for the remaining devices from the address next to the address, at which the test is stopped, by the fail hold process even when the test is stopped because of the match-fail that occurs during the test of a system LSI having a built-in flush memory as a semiconductor device 200. Therefore, the present embodiment does not excessively write data into a flush memory to destroy the device to be tested.

Furthermore, the present embodiment can apply a clock continuously to the remaining semiconductor devices 200 by the fail burst process even when the test is stopped because of the match-fail that occurs during the test of a system LSI having a built-in PLL device as a semiconductor device 200. Therefore, the present embodiment can restart the test immediately without waiting for the PLL to be locked every time when restarting the test. Thus, the present embodiment can reduce the time taken for the test as a whole.

Figure 13:
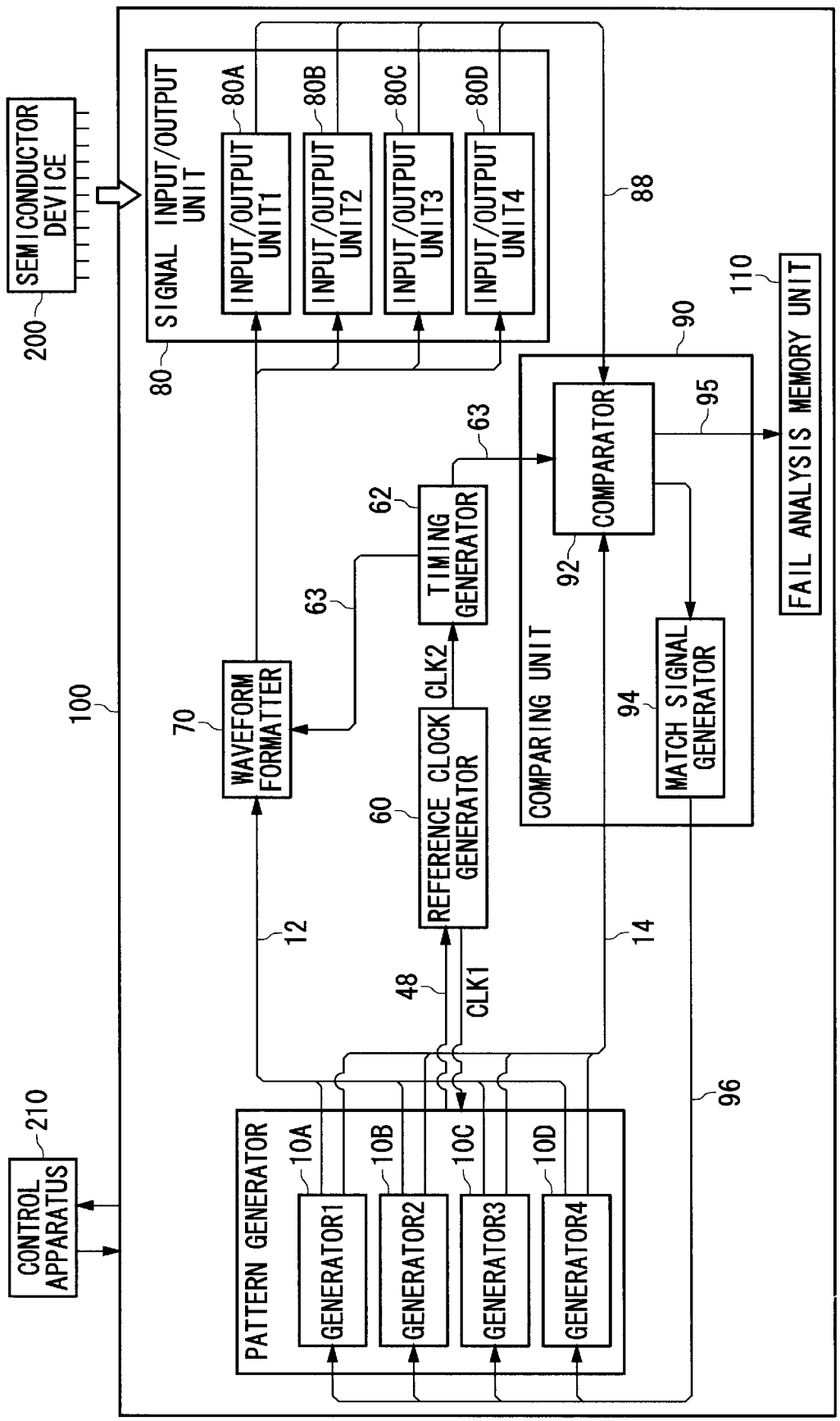
FIG. 13 shows a configuration of the semiconductor device testing apparatus 100 of the second embodiment of the present application.

FIG. 13 shows a configuration of the semiconductor device testing apparatus 100 of the second embodiment of the present application. As shown in FIG. 13, the configuration of the semiconductor device testing apparatus 100 of FIG. 13 is the same as that shown in FIG. 5 except the semiconductor device testing apparatus 100 shown in FIG. 13 has a plurality of pattern generators 10.

The semiconductor device testing apparatus 100 comprises pattern generators 10, the number of which is the same as the number of the signal input/output units 80. The present embodiment comprises four pattern generators 10A, 10B, 10C, and 10D, each of which corresponds with the four signal input/output units 80A, 80B, 80C, and 80D, respectively.

In the present embodiment, each of four pattern generators 10A, 10B, 10C, and 10D outputs an input-signal pattern 12 and an expectation value signal pattern 14 for each of the corresponding semiconductor devices 200, respectively.

Furthermore, if any one of the four pattern generators 10A, 10B, 10C, and 10D outputs the clock control signal 48, the clock signal output to the timing generator 62 is stopped so that the application of the input-signal pattern 12 to all the semiconductor devices 200 is stopped.

As another embodiment, the comparing unit 90 may not have a match signal generator 94, and the comparator 92 may output all the output-signal patterns 88 to each of the pattern generators 10A, 10B, 10C, and 10D that correspond with each of the semiconductor devices 200.

According to the present embodiment, the input-signal pattern 12 and the expectation value signal pattern 14 are output respectively for each of the semiconductor devices 200. Therefore, a plurality of tests that are different for each of the semiconductor devices 200 can be performed.

The third embodiment of the present application will be explained below.

As an example of a semiconductor device to be tested, there is a system LSI having a built-in flush memory, for example. A flush memory is a device, into which the data of an input-signal pattern can be written by repeatedly and continuously applying an input-signal pattern for a predetermined period.

When data cannot be written into any one of a plurality of semiconductor devices perfectly by applying an input-signal pattern for a predetermined period, the semiconductor device testing apparatus 100 of the present embodiment has a stop means that stops the test of a semiconductor device, to which the data is written imperfectly, while the stop means continues the test of the semiconductor device, to which the data is written perfectly.

In the following, if it is detected that the data is written into the semiconductor device perfectly within a predetermined period, we call the event a "match-pass". Also, when it is detected that the data is written into the semiconductor device imperfectly within a predetermined period, we call the above-mentioned event a "match-fail".

In the first and second embodiment, if any one of the semiconductor devices causes the match-fail, the semiconductor device that causes the match-fail is removed from the test object while the test is suspended. Here, as a method for removing the semiconductor device that causes the match-fail from the test object, there is a method of cutting a signal connection for all the semiconductor devices. However, there is a possibility that the match-fail is detected just after restarting the test after the end of the match cycle.

If the test is interrupted again just after the restarting of the test, the value written into the semiconductor device may not become the predetermined value. If this kind of change of condition of the semiconductor occurs, the test may have to be restarted from the beginning depending on the characteristic of the test. Therefore, the time taken for the test increases when the test is restarted.

As another method for removing the semiconductor device that causes the match-fail, there is a method of making a pattern generator not to detect a match signal for the semiconductor device, which causes the match-fail, until the end of the test. However, according to this method, an input-signal pattern is applied to the semiconductor device that causes the match-fail. For example, it is desirable not to apply the input-signal pattern to a flush memory to avoid excessively writing data into the semiconductor device during the re-testing process.

Therefore, the third embodiment provides a semiconductor device testing apparatus and a method for testing a semiconductor device that does not interrupt the test just after restarting the test and also does not apply an input-signal pattern to the semiconductor device that causes a match-fail until the end of the test.

Figure 14:
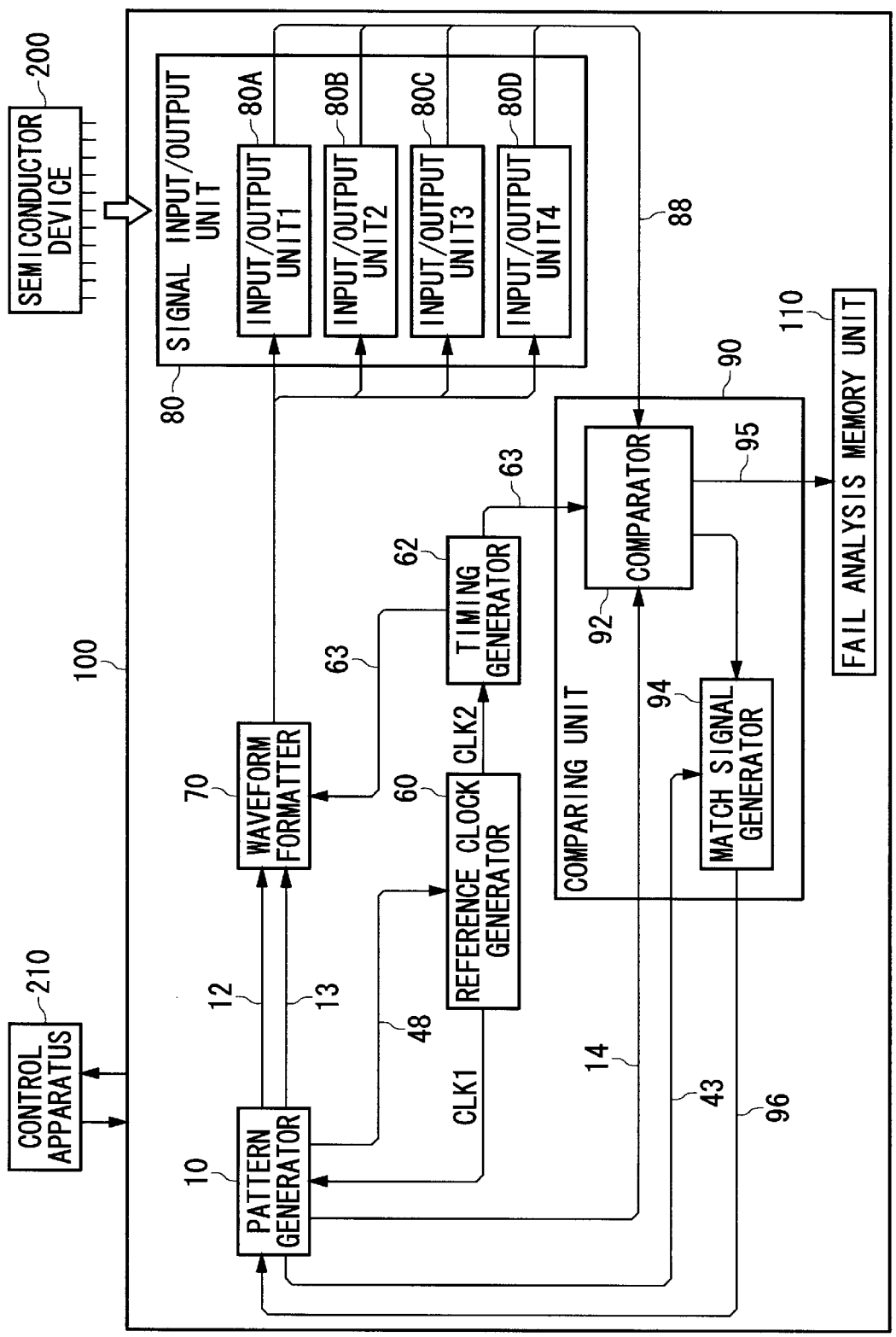
FIG. 14 is a block diagram that shows a configuration of a semiconductor device testing apparatus 100 of the third embodiment.

FIG. 14 is a block diagram that shows a configuration of a semiconductor device testing apparatus 100 of the third embodiment. The semiconductor device testing apparatus 100 comprises a pattern generator 10, a reference clock generator 60, a timing generator 62, a waveform formatter 70, a signal input/output unit 80, a comparing unit 90, and a fail analysis memory unit 110. The main configuration of each unit is almost the same as that of the semiconductor device testing apparatus 100 of the first embodiment. The pattern generator 10 serves as a test signal supplying apparatus. The test signal supplying apparatus supplies an input signal pattern to semiconductor device 200.

In the present embodiment, the operation of a pattern generator 10 and a waveform formatter 70 are different from the operation of the pattern generator 10 and the waveform formatter 70 of the first embodiment.

The pattern generator 10 outputs not only the input-signal pattern 12 and the expectation value signal pattern 14 but also outputs an application stop signal 13 that instructs the waveform formatter 70 to stop the application of the input-signal pattern 12 to the semiconductor device 200. The application stop signal 13 may have bit numbers at least more than the numbers of the semiconductor devices 200.

The application stop signal 13 indicates which semiconductor device 200 should stop the application of the input-signal pattern 12 among a plurality of semiconductor devices 200. Thereby, the present embodiment can stop the application of the input-signal pattern 12 to the desired semiconductor device 200. The pattern generator 10 may instruct the waveform formatter 70 to stop the application of the input-signal pattern 12 to the semiconductor device 200 by outputting the application stop signal 13 to the waveform formatter 70.

The pattern generator 10 stops the application of the input-signal pattern 12 to the semiconductor device 200 when the condition signal of which becomes active. The condition signal indicates the condition of each plurality of semiconductor devices 200. The condition signal becomes active when the semiconductor device passes the test. For example, the pattern generator 10 may stop the application of the input-signal pattern 12 to the semiconductor device 200 when the match signal 96 of which becomes active. In this case, the pattern generator 10 may stop the application of the input-signal pattern 12 to the semiconductor device 200 until the end of the match cycle.

The pattern generator 10 releases the waveform formatter 70 from stopping the application of the input-signal pattern 12 to the semiconductor device 200 and restarts the application. For example, the pattern generator 10 may release the waveform formatter 70 from stopping the application and restarts the test after the match cycle ends.

The pattern generator 10 stops the application of the input-signal pattern 12 to the semiconductor devices 200 except the semiconductor devices 200 for which the application of the input-signal pattern 12 is restarted. For example, the pattern generator 10 may stop the application of the input-signal pattern 12 to the semiconductor devices 200 except the semiconductor device 200 that receives the match signal 96 during the match cycle. The semiconductor devices 200 except the semiconductor devices 200, which receives the match signal 96 during the match cycle, is the semiconductor devices 200 that causes the match-fail. The semiconductor device 200 that causes the match-fail is a semiconductor device that fails in the test. In this case, the pattern generator 10 may stop the application of the input-signal pattern 12 to the device that causes a match-fail until the end of the test.

The waveform formatter 70 formats the waveform of the input-signal pattern 12 based on the timing signal 63 so that the waveform of the input-signal pattern 12 adopts the characteristic of each of the semiconductor devices 200. Furthermore, the waveform formatter 70 may control the application of the input-signal pattern 12 to the semiconductor device 200 based on the timing signal 63 and the application stop signal 13. For example, the waveform formatter 70 may stop at least a part of the output of the input-signal pattern 12, the waveform of which is formatted, while the waveform formatter 70 receives the application stop signal 13.

For example, in case the semiconductor device 200 is a system LSI having a built-in PLL device 206, the waveform formatter 70 may continue to output the clock signal while the waveform formatter 70 stops the output of the signal except the clock signal. Therefore, the semiconductor device testing apparatus 100 can restart the test without waiting for the PLL device 206 to be locked.

Figure 15:
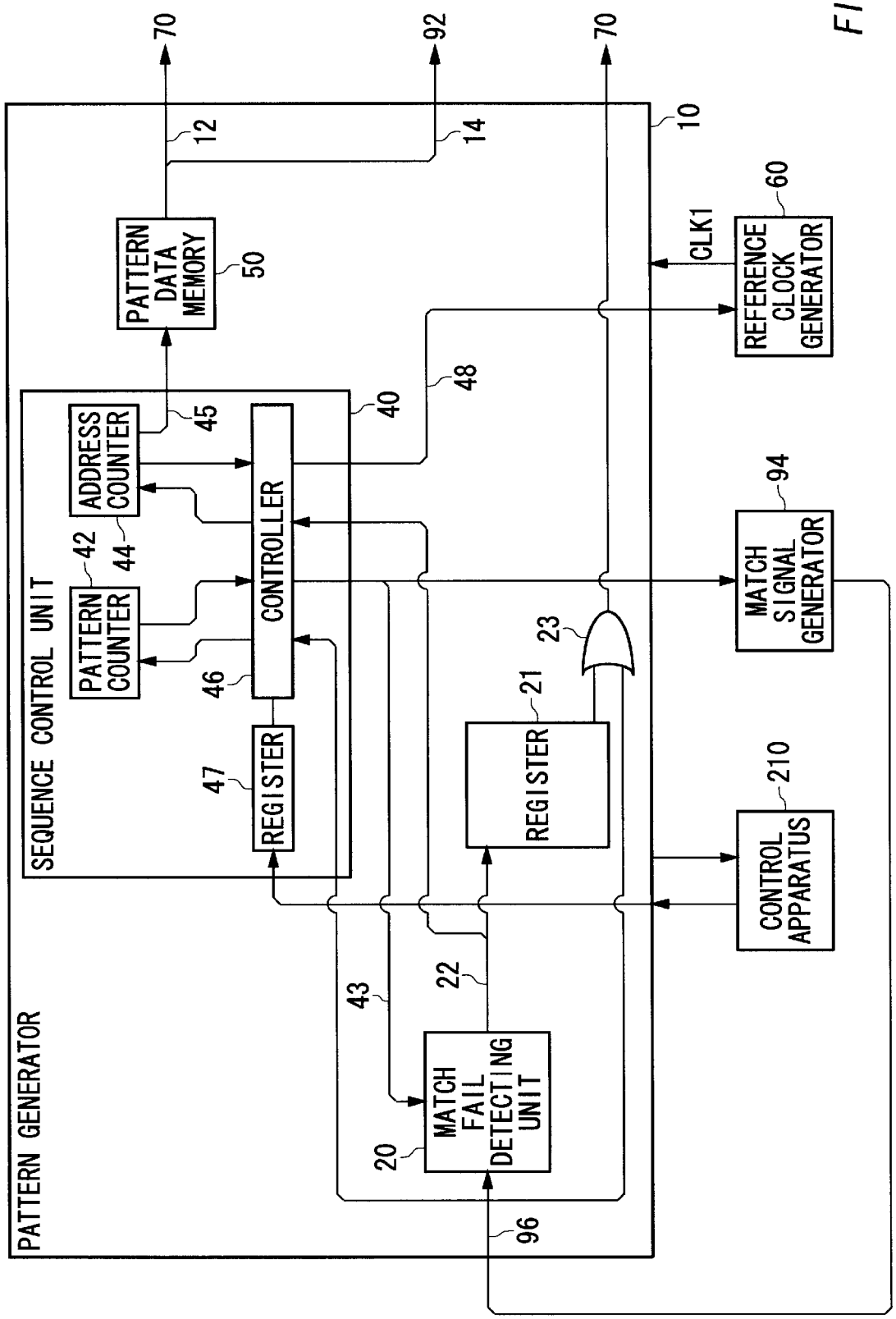
FIG. 15 shows a configuration of a pattern generator 10.

FIG. 15 shows a configuration of a pattern generator 10. The pattern generator 10 of the present embodiment has a sequence control unit 40, a pattern data memory 50, a match-fail detecting unit 20, a match-fail register 21, and a stop signal output unit 23. The configurations other than the match-fail register 21 and the stop signal output unit 23 are substantially similar to the configurations of the first embodiment and second embodiment.

The match-fail detecting unit 20 detects whether the match-fail occurs at any one of a plurality of semiconductor devices 200. The match-fail detecting unit 20 of the present embodiment is provided inside the pattern generator 10. However, the match-fail detecting unit 20 may be provided outside the pattern generator 10. Moreover, the match-fail detecting unit 20 may be provided inside the comparing unit 90.

The match-fail register 21 stores which semiconductor device 200 causes the match-fail when the match-fail detecting unit 20 detects a match-fail. The control apparatus 210 performs the writing process to the match-fail register 21.

The stop signal output unit 23 outputs an application stop signal 13 for both of the semiconductor device 200, which is stored in the match-fail register 21, and the semiconductor device 200, the match signal 96 of which becomes active during the match cycle. A logical addition circuit may be used for the stop signal output unit 23, for example. Thereby, the application stop signal 13 is continuously and forcibly output to the semiconductor device 200 that causes the match-fail. The stop signal output unit 23 outputs an application stop signal 13 to stop applying the input-signal pattern 12 to the semiconductor device 200, which causes the match-fail, until the end of the test.

On the other hand, the application stop signal 13 is output to the semiconductor device 200 that does not cause the match-fail while the match signal 96 can be obtained.

Therefore, the application of the input-signal pattern 12 is stopped for the device, which passes the matching process, during the period from the time that the match-pass is obtained to the time that the match cycle ends. Therefore, the application of the input-signal pattern 12 is stopped for the match-passed device during the period from the time of the passing of the matching process to the time of ending of the match cycle.

Figure 16:
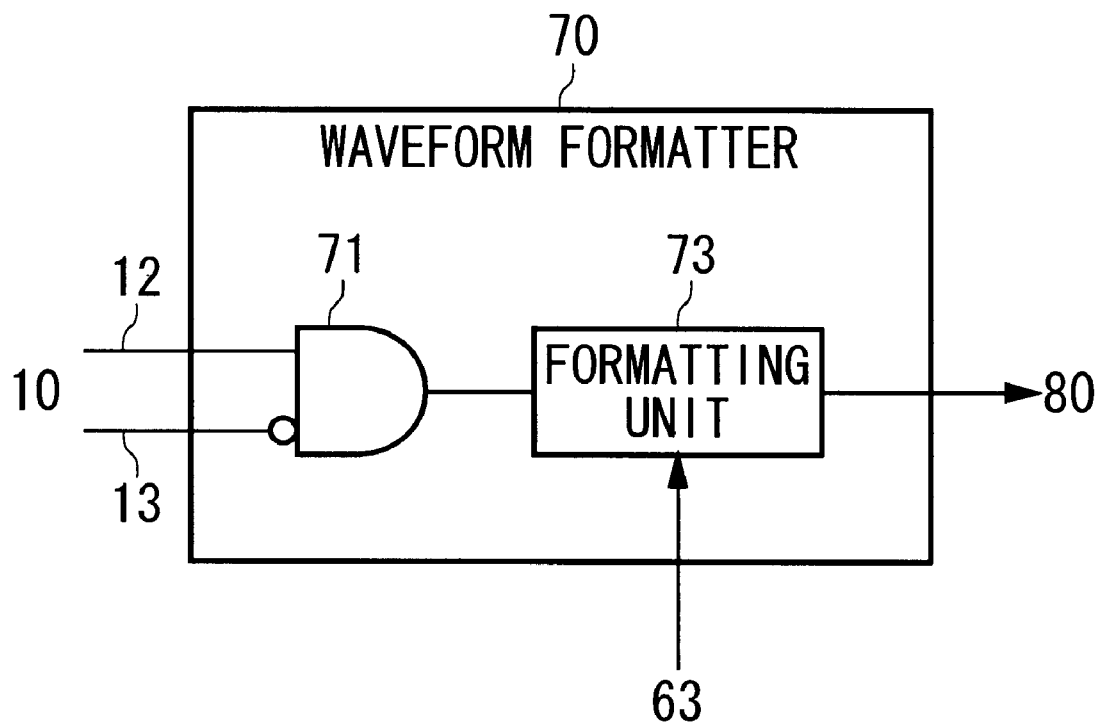
FIG. 16 shows a configuration of a waveform formatter 70.

FIG. 16 shows a configuration of a waveform formatter 70. The waveform formatter 70 has a signal control unit 71 and a formatting unit 73. The signal control unit 71 receives the input-signal pattern 12 and the application stop signal 13. Then, the signal control unit 71 outputs an input-signal pattern 12 to the formatting unit 73 when the application stop signal 13 is not active.

A logical multiplication circuit can be used for a signal control unit 71. In this case, the value that inverts the application stop signal 13 may be input to the signal control unit 71. A plurality of the signal control units 71, the number of which is the same as the number of the semiconductor devices 200 to be tested at the same time, may be provided to the waveform formatter 70. Moreover, a plurality of the signal control units 71, the number of which is the same as the number of the input pins of the semiconductor devices 200, may be provided to the waveform formatter 70.

The formatting unit 73 formats the waveform of the input-signal pattern 12 based on the timing signal 63 so that the waveform of the input-signal pattern 12 adopts the characteristic of each of the semiconductor devices 200.

Figure 17:
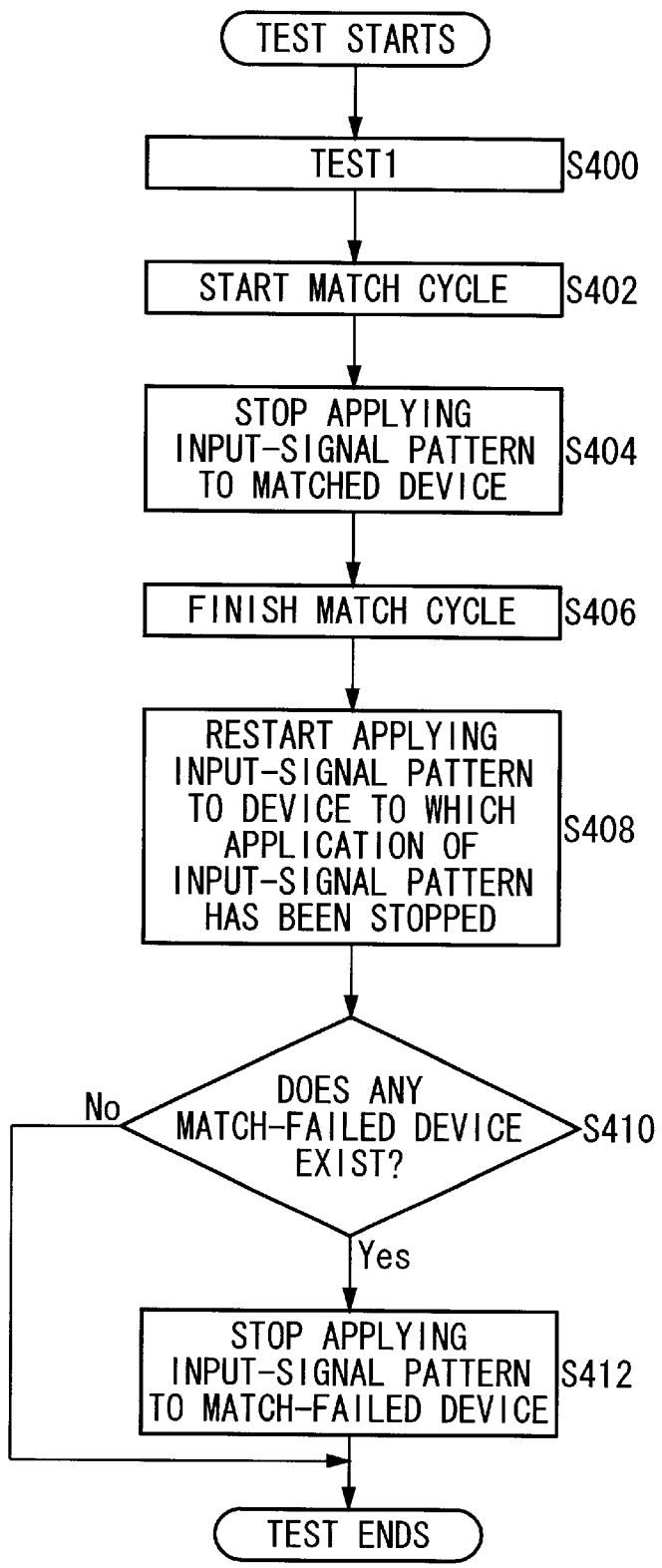
FIG. 17 is a flow chart that shows the process for testing a plurality of semiconductor devices 200 at the same time.

FIG. 17 is a flow chart that shows the process for testing a plurality of semiconductor devices 200 at the same time. First, a test 1 is performed (S400). A match cycle starts after the finish of the test 1 (S402). The application of the input-signal pattern 12 to the semiconductor devices 200, which pass the matching process during the match cycle, are stopped sequentially (S404). The match cycle finishes after the predetermined period has elapsed (S406). Then, the application of the input-signal pattern 12 to the semiconductor device 200, to which the application has been stopped, is restarted (S408, test2). Here, if there is a semiconductor device 200 that cannot pass the matching process (S410, yes), the application of the input-signal pattern 12 to the semiconductor device 200 that causes match-fail is stopped (S412). On the other hand, if all semiconductor devices 200 pass the matching process (S410, no), the test ends. Then, a test and a match cycle are performed repeatedly (not shown in figure), and the test ends.

Figure 18:
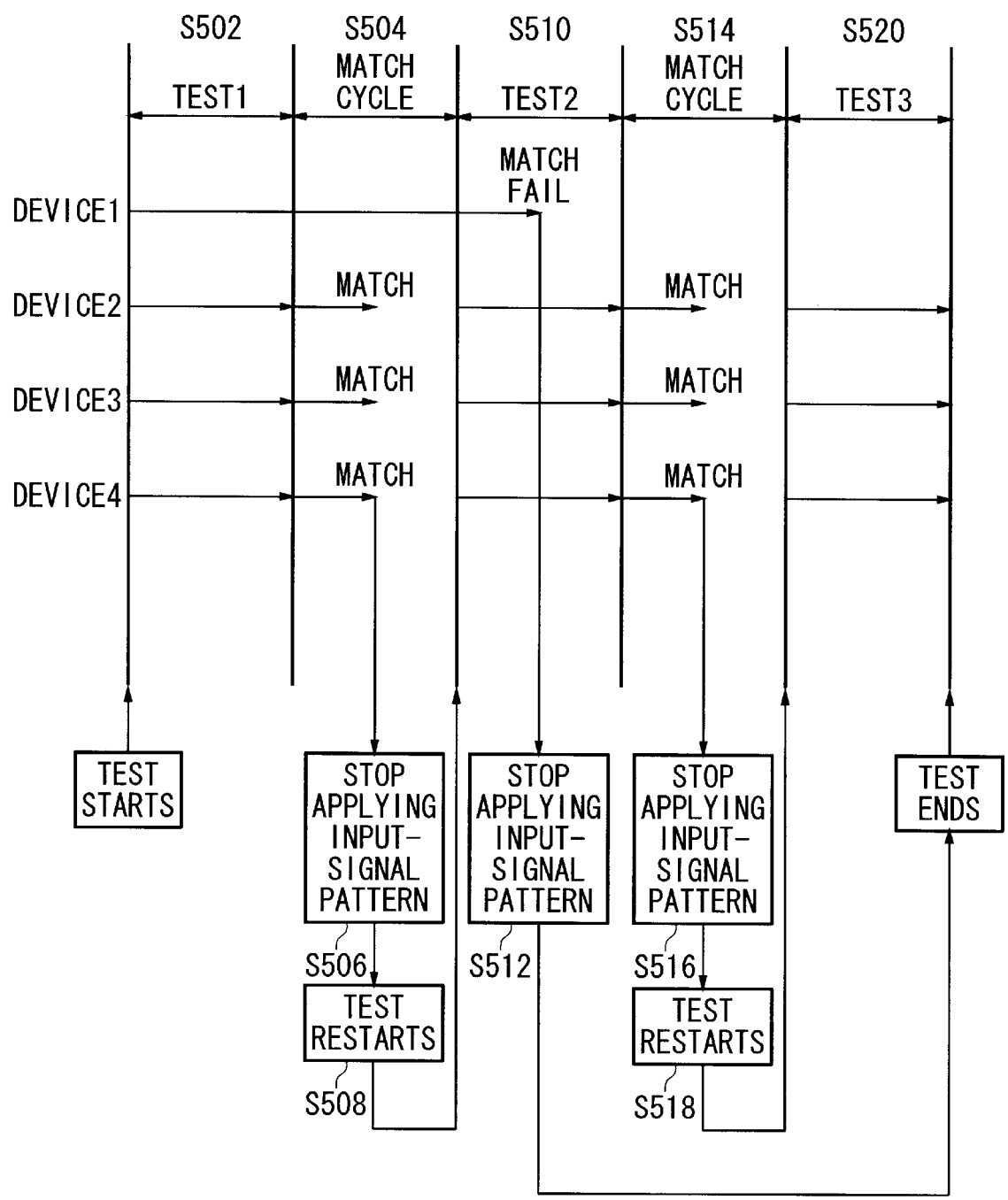
FIG. 18 is a time chart that shows the process for testing a plurality of semiconductor devices 200 at the same time.

FIG. 18 is a time chart that shows the process for testing a plurality of semiconductor devices 200 at the same time. First, a test 1 is performed (S502). Then, whether the semiconductor device 200 is match-passed or match-failed is checked for a plurality of the semiconductor devices 200 during the match cycle (S504). Then, the application of the input-signal pattern 12 to the semiconductor device 200 is stopped sequentially for the device that is match-passed (S506). After the end of the match cycle, the application stop instruction is released, and the test is restarted (S508). Here, if there is a device that causes a match-fail, the application of the input-signal pattern 12 is stopped only for the device that is match-failed (S512) without interrupting the test 2 for other devices (S510). The application stop instruction for the match-failed device continues until the end of the test (S512).

Next, when the test 2 (S510) is finished, whether the remaining semiconductor device 200 is match-passed or match-failed is checked during the second match cycle (S514). Then, the application of the input-signal pattern 12 to the semiconductor device 200 is stopped sequentially for the device that is match-passed (S516). After the end of the match cycle, the application stop instruction is released, and the test is restarted (S518). Then, the test continues until the end of the test without interrupting the test 3 (S520).

Figure 19:
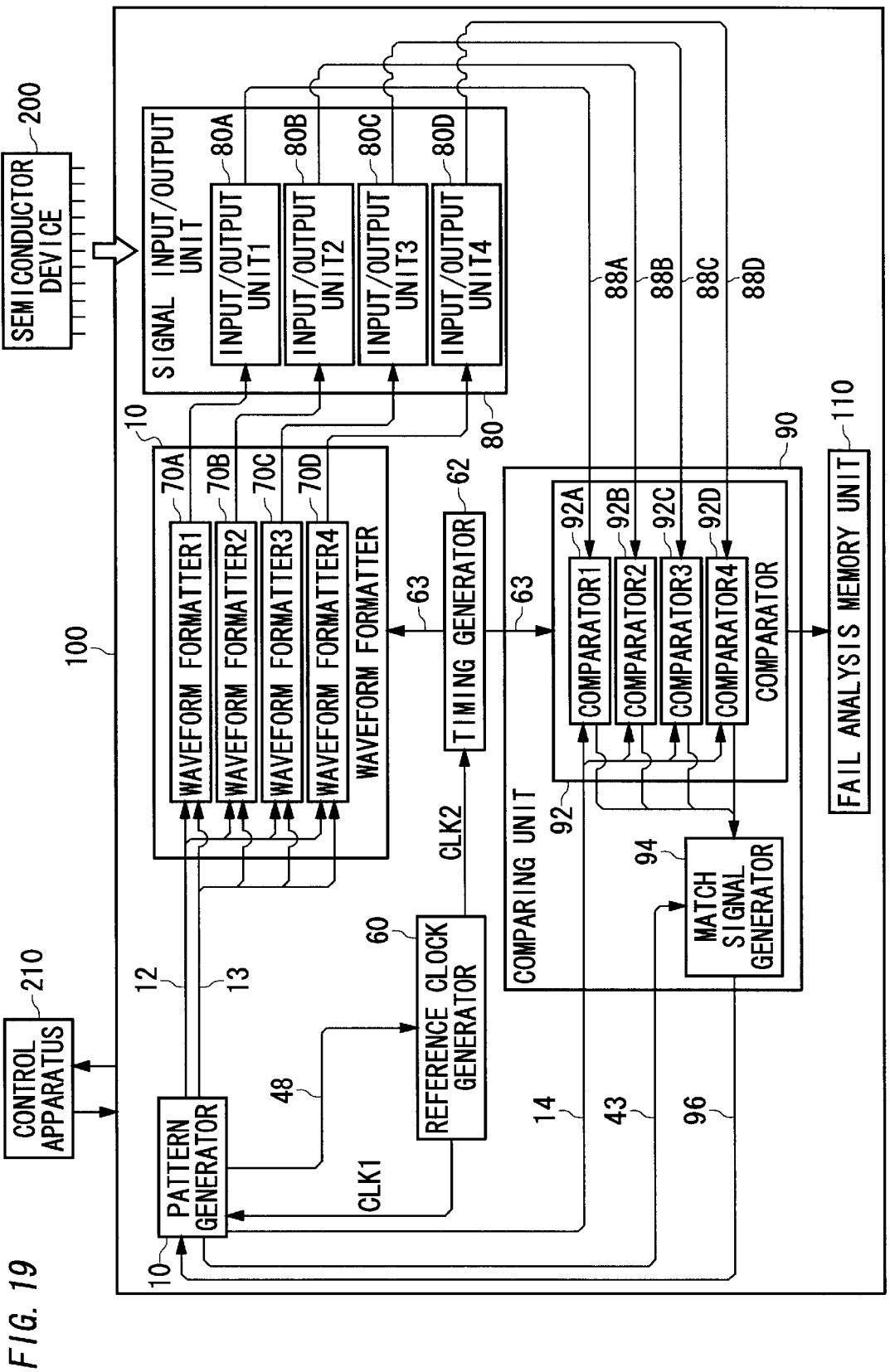
FIG. 19 is a block diagram that shows other configurations of a semiconductor device testing apparatus 100 of the present embodiments.

FIG. 19 is a block diagram that shows other configurations of a semiconductor device testing apparatus 100 of the present embodiments.

In the present embodiment, each of the numbers of waveform formatters 70A–70D and comparators 92A–92D are the same as the numbers of the semiconductor devices 200 to be tested. The configuration of the semiconductor device testing apparatus 100 shown in FIG. 19 is substantially the same as that of the third embodiment shown in FIG. 14 except the configuration of the waveform formatter 70 and the comparator 92.

The waveform formatter 70 has a plurality of waveform formatters 70A–70D. The plurality of waveform formatters 70A–70D is provided so that each of the waveform formatters 70 corresponds with each of the semiconductor devices 200, respectively.

The same input-signal pattern 12 is input to each of a plurality of the waveform formatters 70A–70D. Individual application stop signals 13 are input to each of the plurality of the waveform formatters 70A–70D, respectively. Each of the plurality of the waveform formatters 70A–70D formats the waveform of the input-signal pattern 12 based on the timing signal 63 and outputs the formatted input-signal pattern 12 to the corresponding semiconductor device 200.

The comparing unit 90 has a plurality of comparing units 90A–90D. The plurality of comparators 92A–92D is provided to the semiconductor device testing apparatus 100 so that each of the comparators 92A–92D corresponds with the individual semiconductor devices 200, respectively. Each plurality of comparators 92A–92D receives an output-signal pattern from the corresponding semiconductor devices 200, respectively. The same expectation value signal pattern 14 is input to the plurality of the comparators 92A–92D.

Each of the plurality of comparators 92A–92D performs a logical comparison between the output-signal pattern 88 and the expectation value signal pattern 14 and outputs a signal that contains match bits, respectively. The match signal generator 94 outputs a match signal that indicates which devices are match-passed while receiving the match cycle signal 43 from the pattern generator 10. For example, the match signal generator 94 outputs an active match signal, in which the bit that indicates the device that is match-passed is made to be active.

Figure 20:
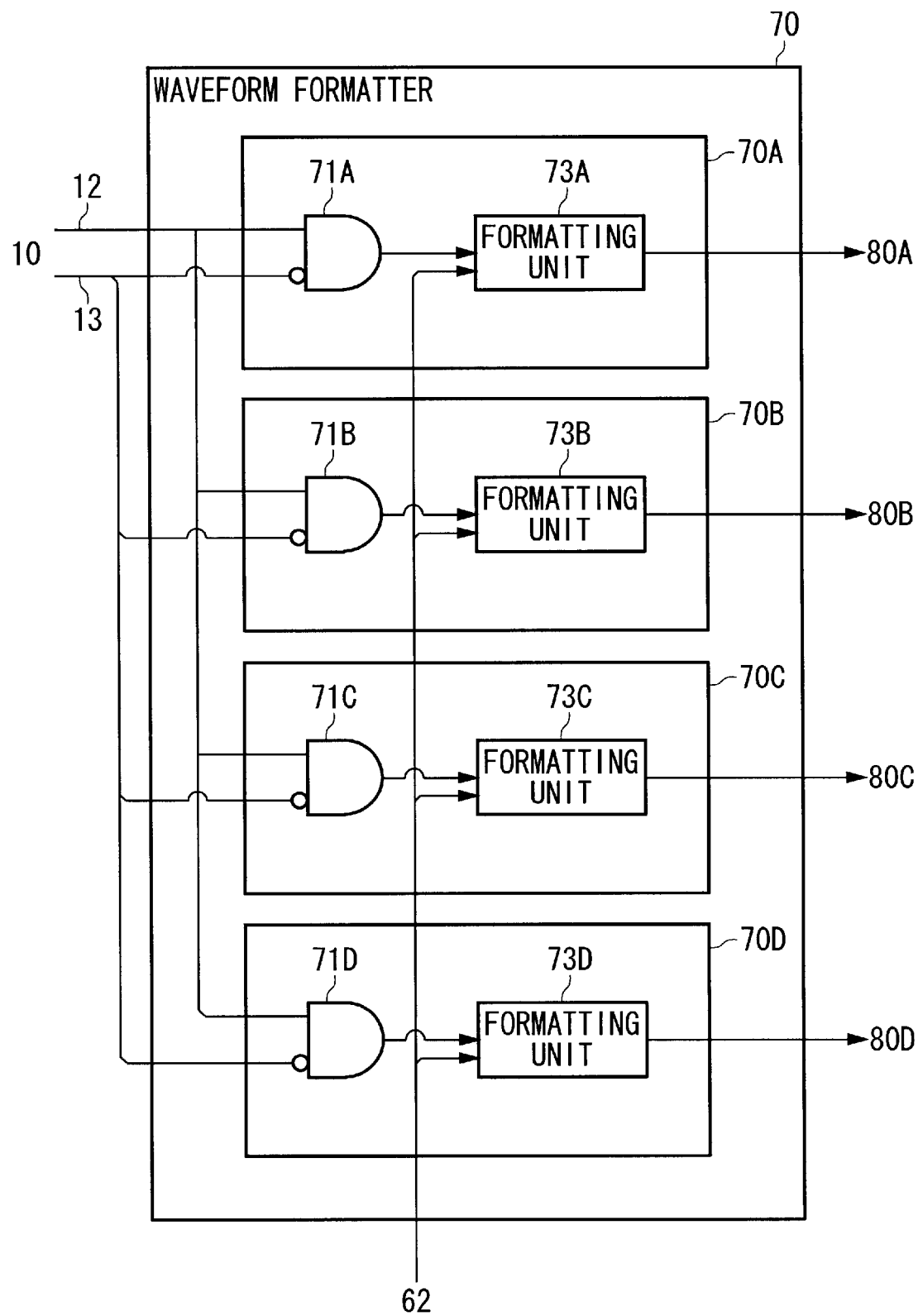
FIG. 20 shows a configuration of a waveform formatter 70 of the present embodiment.

FIG. 20 shows a configuration of a waveform formatter 70 of the present embodiment. The waveform formatter 70 has a plurality of waveform formatters 70A–70D. Each of the waveform formatters 70A–70D has signal control units 71A–71D and formatting units 73A–73D, respectively. Each operation of the signal control units 71A–71D and the formatting units 73A–73D are the same as that of the signal control unit 71 and the formatting unit 73 in the third embodiment.

As is clear from the above description, the semiconductor device testing apparatus of the present embodiment can reduce the test time for testing a plurality of semiconductor devices.

Although the present invention has been described by way of exemplary embodiments, it should be understood that those skilled in the art might make many changes and substitutions without departing from the spirit and the scope of the present invention, which is defined only by the appended claims.

What is claimed is:

1. A test signal supplying apparatus for a semiconductor device testing apparatus that tests a plurality of semiconductor devices; comprising:

a test pattern generating unit for outputting an input signal pattern to said semiconductor devices and receiving a match signal which indicates said semiconductor device, to which said input signal pattern is applied, is passed in said test; and a match-fail detecting unit for receiving said match signal to detect a semiconductor device that fails in said test and outputting a match-fail signal for identifying said semiconductor device that fails in said test; and a stop signal output unit connected to said match-fail detecting unit for receiving said match-fail signal from said match-fail detecting unit, storing said match-fail signal, and outputting a first stop signal that stops an application of said input signal pattern to said semiconductor devices that fail in said test identified by said stored match-fail signal.

2. A test signal supplying apparatus as claimed in claim 1, wherein said stop signal output unit further outputs a second stop signal that stops application of said input signal pattern to said semiconductor devices that passes said test indicated by said match signal.

3. A test signal supplying apparatus as claimed in claim 2, wherein said stop signal output unit has a register connected to said match-fail detecting unit for receiving said match-fail signal from said match-fail detecting unit and storing said match-fail signal.

4. A test signal supplying apparatus as claimed in claim 3, wherein said stop signal output unit further has a logical addition circuit connected to said register for receiving said match signal and said match-fail signal stored in said register to output said first stop signal or said second stop signal.

5. A test signal supplying apparatus as claimed in claim 2, wherein:

said stop signal output unit outputs said second stop signal during a predetermined cycle; and said test pattern generating unit outputs said input signal pattern after the end of said predetermined cycle.

6. A test signal supplying apparatus as claimed in claim 1, wherein:

said stop signal output unit outputs said second stop signal during a predetermined cycle; and said test pattern generating unit restarts said application of said input signal pattern to said semiconductor devices after the end of said predetermined cycle.

7. A test signal supplying apparatus as claimed in claim 1, wherein:

said stop signal output unit outputs said first stop signal until the end of said test.

8. A semiconductor device testing apparatus for testing a plurality of semiconductor devices; comprising:

a test pattern generating unit for outputting an input signal pattern to said semiconductor devices and outputting an expectation value signal pattern, which is expected to be output from said semiconductor device when said input signal pattern is applied to said semiconductor device;

a comparator that compares an output signal patterns, which are output from said plurality of semiconductor devices, and a predetermined value determined based on said expectation value signal pattern and outputs a match signal when said output signal patterns match said predetermined value;

a match-fail detecting unit for receiving said match signal to detect a semiconductor device, said output signal pattern of which does not match said predetermined value, and outputting a match-fail signal for identifying said semiconductor device, said output signal pattern of which does not match said predetermined value; and a stop signal output unit connected to said match-fail detecting unit for receiving said match-fail signal from said match-fail detecting unit, storing said match-fail signal, and outputting a first stop signal that stops application of said input signal pattern to said semiconductor devices, said output signal patterns of which does not match said predetermined value, identified by said stored match-fail signal.

9. A semiconductor device testing apparatus as claimed in claim 8, wherein said stop signal output unit further outputs a second stop signal that stops application of said input signal pattern to said semiconductor devices, said output signal patterns of which matches said predetermined value.

10. A semiconductor device testing apparatus as claimed in claim 9, wherein said stop signal output unit has a register connected to said match-fail detecting unit for receiving said match-fail signal from said match-fail detecting unit and storing said match-fail signal.

11. A semiconductor device testing apparatus as claimed in claim 10, wherein said stop signal output unit further has a logical addition circuit connected to said register for receiving said match signal and said match-fail signal stored in said register to output said first stop signal or said second stop signal.

12. A semiconductor device testing apparatus as claimed in claim 9, further comprising a waveform formatter connected to said test pattern generating unit and said stop signal output unit for receiving said input signal pattern from said test pattern generating unit, receiving said first stop signal or said second stop signal from said stop signal output unit, formatting and outputting said input signal pattern except when receiving said first stop signal or said second stop signal.

13. A semiconductor device testing apparatus as claimed in claim 12, wherein said waveform formatter outputs said input signal pattern except when said waveform formatter receives said first stop signal until the end of said test.

14. A semiconductor device testing apparatus as claimed in claim 9, wherein:

said stop signal output unit outputs said second stop signal during a predetermined cycle; and said test pattern generating unit outputs said input signal pattern to said waveform formatter after the end of said predetermined cycle.

15. A method for testing a plurality of semiconductor devices; comprising:

outputting an input signal pattern to said semiconductor devices;

outputting an expectation value signal pattern, which is expected to be output from said semiconductor device when said input signal pattern is applied to said semiconductor device;

comparing an output signal patterns, which are output from said plurality of semiconductor devices, and a predetermined value determined based on said expectation value signal pattern;

outputting said match signal when said output signal patterns matches said predetermined value;

outputting a match-fail signal when said output signal pattern output from said semiconductor device does not match said predetermined value;

storing said match-fail signal; and outputting a first stop signal for stopping an application of said input signal pattern to said semiconductor devices identified by said stored match-fail signal.

16. A method as claimed in claim 15, wherein said outputting said first stop signal further outputs a second stop signal that stops application of said input signal pattern to said semiconductor devices when said output signal patterns matches said predetermined value.

17. A method as claimed in claim 16, further comprising: formatting and outputting said input signal pattern to said semiconductor device except when receiving said first stop signal or said second stop signal.

18. A method as claimed in claim 17, wherein said formatting and outputting outputs said input signal pattern except when receiving said first stop signal until the end of said test.

19. A method as claimed in claim 16, wherein:

said outputting said second stop signal outputs said second stop signal during a predetermined cycle; and said outputting said input signal pattern outputs said input signal pattern after the end of said predetermined cycle.

20. A method for testing a semiconductor device for testing a plurality of semiconductor devices, comprising:

applying an input signal pattern to each of said plurality of semiconductor devices;

stopping an application of said input signal pattern to said semiconductor devices that output an active match signal, said match signal becomes active when an output signal pattern output from said semiconductor device matches a predetermined value; and restarting said application of said input signal pattern only to said semiconductor devices that output said active match signal.

21. A method as claimed in claim 20, wherein said stopping further stops applying said input signal pattern to said plurality of semiconductor devices except said semiconductor device to which said application of said input signal pattern is restarted by said restarting.

22. A method as claimed in claim 21, wherein said stopping further stops applying said input signal pattern to said plurality of semiconductor devices except said semiconductor devices to which said application of said input signal pattern is restarted until the end of said test.

23. A method as claimed in claim 20, wherein:

said stopping stops applying said input signal pattern to said semiconductor devices that output said active match signal during a predetermined cycle; and said restarting restarts said application of said input signal pattern to said semiconductor devices after the end of said predetermined cycle.

24. A method as claimed in claim 20, further comprising:

generating an input signal pattern that is to be input to said plurality of semiconductor devices, and an expectation value signal pattern that is expected to be output from said plurality of semiconductor devices when said input signal pattern is applied to said semiconductor device; and comparing a plurality of said output signal patterns output from said plurality of semiconductor devices and said predetermined value determined based on said expectation value signal pattern and outputs said active match signal when said output signal pattern matches said predetermined value.

25. A method as claimed in claim 24, further comprising:

formatting a waveform of said input signal pattern; and outputting said formatted input signal pattern to said semiconductor device;

wherein:

said formatting includes:

stopping an output of at least a part of said input signal pattern to said semiconductor device that outputs said active match signal;

restarting said output of said input signal pattern only to said semiconductor devices that output said active match signal; and stopping said application of said input signal pattern to said plurality of semiconductor devices except said semiconductor device to which said application of said input signal pattern is restarted.

26. A method as claimed in claim 25, wherein said stopping outputs a first stop signal that stops applying said input signal pattern to said semiconductor devices that outputs said active match signal.

27. A method as claimed in claim 26, wherein:

said stopping further outputs a second stop signal that stops applying said input signal pattern to said semiconductor devices except said semiconductor device to which said application of said input signal pattern is restarted by said restarting.

28. A method as claimed in claim 27, wherein:

said stopping further includes detecting whether any one of said plurality of semiconductor devices does not output said active match signal during a predetermined cycle.

29. A method as claimed in claim 28, wherein:

said stopping further includes:

storing which of said semiconductor devices do not output said active match signal that is detected by said detecting during said predetermined cycle; and outputting said first stop signal when said semiconductor device outputs said active match signal during said predetermined cycle or when said semiconductor device is stored by said storing.

30. A method as claimed in claim 29, wherein:

said outputting said stop signal further outputs said second stop signal until the end of said test.

31. A method for testing a plurality of semiconductor devices, comprising:

testing said semiconductor device by applying an input signal pattern repeatedly to said semiconductor device for a predetermined period; and stopping said test of said semiconductor device to which an input signal pattern is written imperfectly while continuing said testing for said semiconductor device to which said input signal pattern is written perfectly.

* * * * *